US012813332B2

(12) United States Patent
Liu et al.

(10) Patent No.: US 12,813,332 B2
(45) Date of Patent: Nov. 24, 2026

(54) DISPLAY PANEL AND DISPLAY DEVICE

(71) Applicant: Shanghai Tianma Micro-Electronics Co., Ltd., Shanghai (CN)

(72) Inventors: Xiaoli Liu, Shanghai (CN); Sitao Huo, Shanghai (CN); Cao Liu, Shanghai (CN)

(73) Assignee: Shanghai Tianma Micro-Electronics Co., Ltd., Shanghai (CN)

(*) Notice: Subject to any disclaimer, the term of this patent is extended or adjusted under 35 U.S.C. 154(b) by 806 days.

(21) Appl. No.: 17/843,463

(22) Filed: Jun. 17, 2022

(65) Prior Publication Data

US 2023/0317697 A1 Oct. 5, 2023

(30) Foreign Application Priority Data

Mar. 31, 2022 (CN) ........................ 202210344333.0

(51) Int. Cl.

| | |
|---|---|
| ***H10W 90/00*** | (2026.01) |
| ***H10H 20/819*** | (2025.01) |
| ***H10H 20/853*** | (2025.01) |
| ***H10H 20/855*** | (2025.01) |
| *H10W 72/00* | (2026.01) |
| *H10W 72/20* | (2026.01) |

(52) U.S. Cl.

CPC .......... *H10W 90/00* (2026.01); *H10H 20/819* (2025.01); *H10H 20/853* (2025.01); *H10H 20/855* (2025.01); *H10W 72/07255* (2026.01); *H10W 72/221* (2026.01); *H10W 72/2524* (2026.01); *H10W 90/722* (2026.01)

(58) Field of Classification Search

CPC .. H01L 25/167; H10H 20/819; H10H 20/853; H10H 20/855; H10K 59/878; H10W 90/00; G09F 9/33

See application file for complete search history.

(56) References Cited

U.S. PATENT DOCUMENTS

| | | | | |
|---|---|---|---|---|
| 2017/0133357 | A1* | 5/2017 | Kuo | H10H 20/85 |
| 2020/0203669 | A1* | 6/2020 | Shin | G06F 3/0443 |
| 2020/0343488 | A1* | 10/2020 | Huang | H10K 59/8791 |
| 2021/0111324 | A1 | 4/2021 | Chung et al. | |
| 2021/0335882 | A1* | 10/2021 | Fan | H01L 25/0753 |
| 2022/0393075 | A1* | 12/2022 | Li | H01L 25/0753 |
| 2023/0142687 | A1* | 5/2023 | Ren | H10K 59/38 257/40 |
| 2024/0047629 | A1* | 2/2024 | Zhou | H01L 25/167 |

FOREIGN PATENT DOCUMENTS

| | | | |
|---|---|---|---|
| CN | 104362169 | A | 2/2015 |
| CN | 110875346 | A | 3/2020 |
| CN | 111477653 | A | 7/2020 |
| CN | 112133734 | A | 12/2020 |
| CN | 112768471 | A | 5/2021 |
| CN | 213936188 | U | 8/2021 |
| CN | 113488498 | A | 10/2021 |

* cited by examiner

*Primary Examiner* — Matthew C Landau
*Assistant Examiner* — Halee Cramer
(74) *Attorney, Agent, or Firm* — Anova Law Group, PLLC

(57) ABSTRACT

A display panel includes a substrate, an array layer, an optical layer, and a plurality of light-emitting devices. The array layer is on the substrate. The optical layer and the plurality of light-emitting devices are located on a side of the array layer away from the substrate. The optical layer is arranged corresponding to intervals between light-emitting devices of the plurality of light-emitting devices.

17 Claims, 13 Drawing Sheets

DISPLAY PANEL AND DISPLAY DEVICE

CROSS-REFERENCE TO RELATED APPLICATION

This application claims priority to Chinese Patent Application No. 202210344333.0, filed on Mar. 31, 2022, the entire content of which is incorporated herein by reference.

TECHNICAL FIELD

The present disclosure relates to the display technology field and, more particularly, to a display panel and a display device.

BACKGROUND

With the continuous development of display technology, a display panel has been widely used. However, the display panel in the existing technology still has some technical problems to be solved, for example, how to improve the display effect of the display panel.

SUMMARY

Embodiments of the present disclosure provide a display panel, including a substrate, an array layer, an optical layer, and a plurality of light-emitting devices. The array layer is on the substrate. The optical layer and the plurality of light-emitting devices are located on a side of the array layer away from the substrate. The optical layer is arranged corresponding to intervals between light-emitting devices of the plurality of light-emitting devices.

Embodiments of the present disclosure provide a display device including a display panel. The display panel includes a substrate, an array layer, an optical layer, and a plurality of light-emitting devices. The array layer is on the substrate. The optical layer and the plurality of light-emitting devices are located on a side of the array layer away from the substrate. The optical layer is arranged corresponding to intervals between light-emitting devices of the plurality of light-emitting devices.

DETAILED DESCRIPTION OF THE EMBODIMENTS

Figure 1:
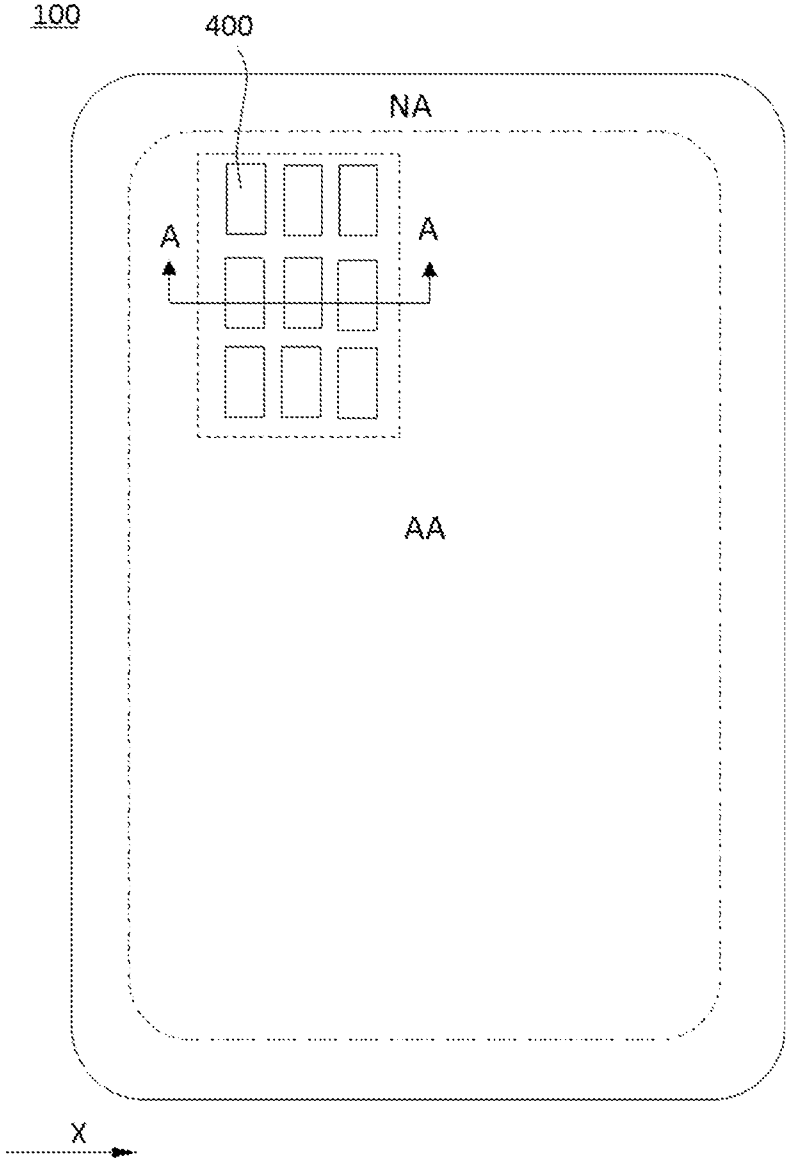
FIG. 1 is a schematic top view of a display panel according to some embodiments of the present disclosure.

In order to make the purposes, features, and advantages of the present disclosure clearer, the present disclosure is further described below in connection with the accompanying drawings and embodiments.

In the following description, details are described to facilitate a thorough understanding of the present disclosure. However, the present disclosure can be implemented in many other manners different from those described here. Those skilled in the art can make similar promotions without departing from the essence of the present disclosure. Accordingly, the present disclosure is not limited by the embodiments below.

The term used in embodiments of the present disclosure is only to describe embodiments and is not intended to limit the present disclosure. As used in embodiments of the present disclosure and the appended claims, the singular forms "a," "the," and "this" are intended to include the plural forms as well, unless the context indicates otherwise.

Directional terms such as "up," "down," "left," and "right" described in embodiments of the present disclosure describe a position relationship based on angles shown in the drawings, and should not be construed as a limitation of the present disclosure. Also in the context, when an element is formed "on" or "under" another element, the element can not only be directly formed "on" or "under" the another element but also indirectly formed "on" or "under" the another element through an intermediate element.

Also, example embodiments can be implemented in various forms and should not be construed as limited to embodiments in the description. On the contrary, these embodiments are provided so that the present disclosure is thorough and complete, and the concept of example embodiments can be conveyed to those skilled in the art. Same reference numerals in the drawings denote same or similar structures, and thus repeated descriptions of the same or similar structures are omitted. The term describing a position and a direction in the present disclosure is described by taking the accompanying drawings as examples. However, changes can also be made as required, and the changes are all included in the scope of the present disclosure. The drawings of the present disclosure are only used to illustrate the relative positional relationship, and layer thicknesses of some parts are drawn in an exaggerated manner to facilitate understanding. The layer thicknesses in the drawings do not represent a proportional relationship to the actual layer thicknesses. Also, when there is no conflict, embodiments of the present disclosure and features of embodiments may be combined. The drawings of embodiments of the present disclosure may use the same reference numerals. In addition, similarities between embodiments of the present disclosure are not repeated.

Figure 2:
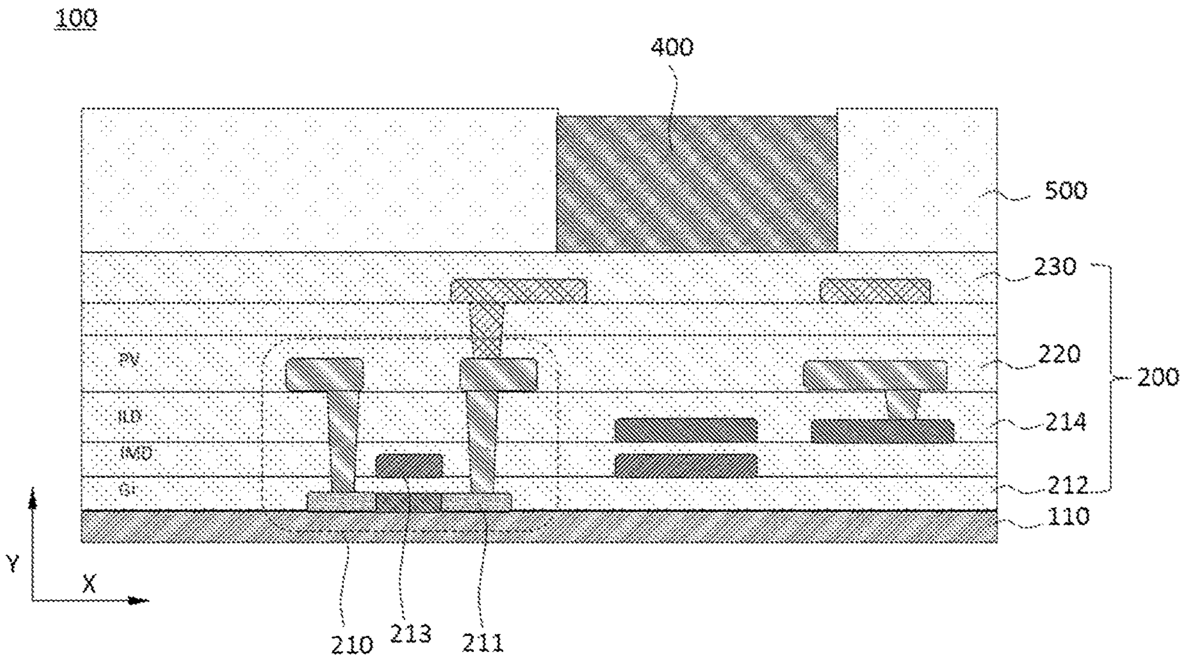
FIG. 2 is a schematic partial cross-section view along an A-A direction of FIG. 1.

FIG. 1 is a schematic top view of a display panel 100 according to some embodiments of the present disclosure. FIG. 2 is a schematic partial cross-section view along an A-A direction of FIG. 1. The cross-section is perpendicular to a plane where the display panel is located.

In some embodiments, the display panel 100 is divided into a display area AA and a non-display area NA surrounding the display area AA. A dotted frame in FIG. 1 is used to indicate a boundary between the display area AA and the non-display area NA. The display area AA may be an area of the display panel configured to display a picture, and include a plurality of pixels sp arranged in an array. The pixels sp may include a light-emitting device (e.g., diode), and a control element (e.g., a thin-film transistor that forms a pixel drive circuit) corresponding to the pixels sp. The non-display area NA surrounds the display area AA and includes a peripheral drive element, a peripheral wiring, and a fan-out area.

In some embodiments, the display panel 100 includes a substrate 110.

In some embodiments, the substrate 110 may be made of a polymeric material such as glass, polyimide (PI), polycarbonate (PC), polyethersulfone (PES), polyethylene terephthalate (PET), polyethylene naphthalene (PEN), polyarylate (PAR), or fiberglass reinforced plastic (FRP). The substrate 110 may be transparent, translucent, or opaque.

In some embodiments, the substrate 110 may be flexible or rigid. In embodiments of the present disclosure, a certain film layer being "on" a certain reference film layer can be understood as being on a side of the reference film layer away from the substrate. Unless otherwise specified, "On" may only indicate a directional relationship, and does not mean that the two film layers are necessarily adjacent or contacting to each other.

An array layer 200 is formed on a side of the substrate 110 facing a display surface or a touch surface of the display panel 100. The array layer 200 includes a plurality of thin-film transistors 210 (TFT) and a pixel circuit formed by the thin-film transistors. The array layer 200 may be used as a light-emitting device in a display layer.

In embodiments of the present disclosure, a top-gate thin-film transistor may be taken as an example to describe the structure of the display panel. A thin-film transistor layer 210 includes an active layer 211 formed on the substrate 110. The active layer 211 may be an amorphous silicon material, a polysilicon material, and a metal oxide material. When the active layer 211 is made of polycrystalline silicon material, the active layer may be formed by using low-temperature amorphous silicon technology. That is, the amorphous silicon material may be melted by laser to form a polycrystalline silicon material. In addition, the active layer may be formed by a method such as a rapid thermal annealing (RTA) method, a solid-phase crystallization (SPC) method, an excimer laser annealing (ELA) method, a metal-induced crystallization (MIC) method, a metal-induced lateral crystallization (MILC) method, or a continuous lateral curing (SLS) method. The active layer 211 may further include a source region and a drain region formed by doping N-type impurity ions or P-type impurity ions, and a channel region between the source region and the drain region.

A gate insulation layer 212 is formed on the active layer 211. The gate insulation layer 212 may include an inorganic layer made of silicon oxide and silicon nitride and may include a single layer or a plurality of layers.

A gate 213 is formed on the gate insulation layer 212. The gate 213 may include a single layer or a plurality of layers made of gold (Au), silver (Ag), copper (Cu), nickel (Ni), platinum (Pt), palladium (Pd), aluminum (Al), molybdenum (MO), or chromium (Cr), or an alloy such as an aluminum (Al):neodymium (Nd) alloy and a molybdenum (MO):tungsten (W) alloy.

An interlayer insulation layer 214 is formed on the gate 213. The interlayer insulation layer 214 may be formed by insulating an inorganic layer made of silicon oxide or silicon nitride. In embodiments of the present disclosure, the interlayer insulation layer may be formed by an organic insulation material.

A source electrode and a drain electrode are on the interlayer insulation layer 214. The source electrode and drain electrode may be electrically connected (or bonded) to the source region and the drain region through a contact hole, respectively. The contact hole may be formed by selectively removing the gate insulation layer 212 and the interlayer insulation layer 214.

The array layer 200 also includes a passivation layer 220. In some embodiments, the passivation layer 220 is formed on the source electrode and the drain electrode of the thin-film transistor 210. The passivation layer 220 may be formed by an inorganic material made of silicon oxide or silicon nitride, or an organic material.

The display panel 100 further includes a planarization layer 230. In some embodiments, the planarization layer 230 is formed on the passivation layer 220. The planarization layer 230 may be made of an organic material such as acrylic, polyimide (PI), or benzocyclobutene (BCB). The planarization layer may have a planarization function.

In some embodiments, the display panel 100 further includes an optical layer 500 and a light-emitting device 400 located on the side of the array layer 200 away from the substrate 110. In some embodiments, the optical layer 500 and the light-emitting device 400 are formed on the planarization layer 230.

In some embodiments, light-emitting devices 400 may be arranged at an interval from each other. The optical layer 500 may be arranged corresponding to the interval of the light-emitting devices 400. At least a part of the optical layer 500 may be located in the interval between two neighboring light-emitting devices 400.

In some embodiments, in a direction (i.e., a first direction X) parallel to the plane where the display panel 100 is located, projections of the optical layer 500 and the light-emitting device 400 may overlap. In a direction (a second direction Y) perpendicular to the plane where the display panel 100 is located, the projections of the optical layer 500 and the light-emitting device 400 may not overlap. That is, an orthographic projection of the optical layer 500 on the plane where the display panel 100 is located and an orthographic projection of the light-emitting device 400 on the plane where the display panel 100 is located may not overlap.

In the present disclosure, the first direction X may be a direction parallel to the plane where the display panel is located, and the second direction Y may be a direction perpendicular to the display panel.

In some embodiments, the optical layer 500 may have a whole-layer structure. That is, the optical layer 500 in intervals between different light-emitting devices 400 may be connected to form an integrated structure. That is, the continuous optical layer 500 may have an opening in which the light-emitting device 400 is arranged.

Based on the above, the light-emitting effect of the display panel may be improved.

In some embodiments, the optical layer 500 may be made of a material with low light transmittance.

In some embodiments, an optical density (OD) value of the optical layer 500 may be greater than 1. That is, the transmittance of the optical layer 500 may be less than 10%.

With such a design, the reflection of ambient light by the display panel may be reduced to reduce reflection, and crosstalk between neighboring pixels may be avoided too.

In some embodiments, the optical layer 500 may be at least a combination of an ink layer or an adhesive layer. For example, in some embodiments of the present disclosure, the optical layer 500 may be made of an ink material. That is, the ink may be printed on a corresponding position, i.e., a space between the light-emitting devices 400, of the array layer 200 through the printing technology. In some other embodiments of the present disclosure, the optical layer 500 may be made of an adhesive film or an adhesive film. The adhesive film can be attached to the array layer 200 in a lamination manner.

When the optical layer is formed by a plurality of sub-layers. Different sub-layers may include one of an ink layer and an adhesive layer. For example, one of two sub-layers may include an ink layer, and the other one may include an adhesive layer.

Figure 3:
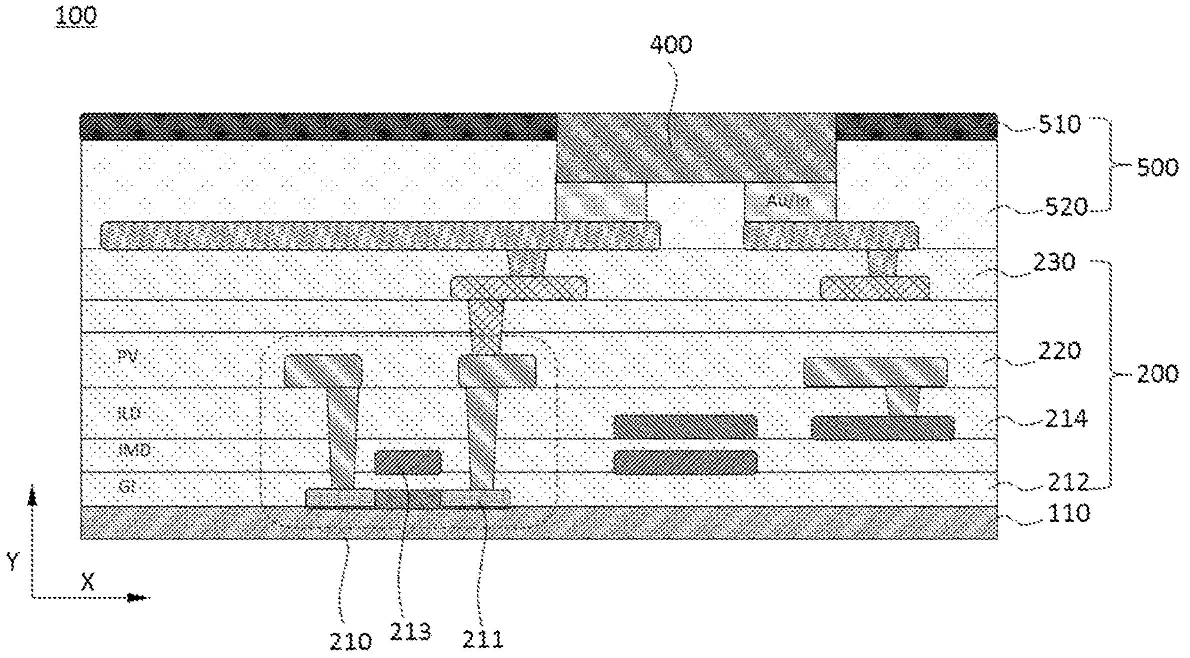
FIG. 3 is another schematic partial cross-section view along the A-A direction of FIG. 1.

FIG. 3 is another schematic partial cross-section view along the A-A direction of FIG. 1. The similarities between FIG. 3 and FIG. 2 are not repeated.

In some embodiments, the optical layer 500 includes a first optical layer 510 and a second optical layer 520 stacked in sequence along a direction from the array layer 200 to the substrate 110.

That is, the second optical layer 520 and the first optical layer 510 are sequentially stacked on the array layer 200. The first optical layer 510 is formed on a side of the second optical layer 520 away from the substrate 110. The first optical layer 510 is on the side of the second optical layer 520 facing the light-emitting surface of the display panel 100.

Reflectivity of the first optical layer 510 may be lower than reflectivity of the second optical layer 520.

In some embodiments, the reflectivity of the first optical layer 510 may be less than 10%, and the reflectivity of the second optical layer 520 may be greater than 50%.

In some embodiments, the optical layer 500 may be formed by two sub-layers that may be matched in reflectivity performance, such as the first optical layer 510 and the second optical layer 520. Since the second optical layer 520 has a strong reflection ability, The light from the side and bottom of the light-emitting device 400 may be focused toward a front view angle direction through reflection by the second optical layer 520 to improve a light utilization rate. On the other hand, the first optical layer 510 may have low reflectivity and strong absorption of light. The first optical layer 510 is on the side closer to the light-emitting surface of the display panel 100. Thus, the first optical layer 510 can absorb light reflected by a film layer formed by the metal material below (e.g., the metal film layer used in the circuit or the electrode structure in the array layer) and the second optical layer 520 and can avoid the reflection of the external ambient light to reduce the reflection effect.

In some embodiments, a total OD after the superposition of the first optical layer 510 and the second optical layer 520 may be greater than 1. That is, the total transmittance after the superposition of the first optical layer 510 and the second optical layer 520 may be less than 10%.

In some other embodiments of the present disclosure, both the first optical layer 510 and the second optical layer 520 may be made of materials with low light transmittance. OD values of the first optical layer 510 and the second optical layer 520 may both be greater than 1. That is, the transmittances of the first optical layer 510 and the second optical layer 520 may be less than 10%.

Therefore, the light reflected by the film layer formed by the metal material under the optical layer may be prevented from being emitted from the light-emitting surface of the display panel passing through the optical layer to affect the display effect.

In some embodiments, the first optical layer 510 may include a black layer. The second optical layer 520 may include a white layer.

With such a design, a light utilization rate may be improved while the reflection is reduced. On one hand, a large amount of light of various colors may be reflected by the white layer. Since the white layer has a strong reflection of the light of various colors, the white layer may reflect light of various colors of the light-emitting device 400 corresponding to different color pixels. The light of the various colors may be converged in the front view angle direction to improve the light utilization rate and the consistency of the light-emitting of the different light-emitting devices. On the other hand, the white layer of embodiments of the present disclosure, i.e., the second optical layer, may also have a good light-shielding effect for the film layer formed by the metal material below. The black layer, i.e., the first optical layer, may have strong light absorption and can absorb the light reflected by the film layer formed by the metal material below and the white layer to reduce the reflection.

In some embodiments, the second optical layer 520 may include white nanoparticles, such as titanium dioxide ($TiO_2$).

With such a design, a probability of diffuse reflection of the light emitted by the light-emitting device 400 may be increased in the second optical layer 520. Thus, a propagation direction of more light emitted from the light-emitting device 400 in a lateral direction may be changed to cause the propagation direction of the light to shift to be emitted toward the light-emitting surface of the display panel 100 (i.e., the direction from the second optical layer to the first optical layer).

In some embodiments, when the optical layer includes white and black adhesive films, the white and black adhesive films may be attached at one time or two times.

In some embodiments, when the optical layer includes white and black inks, the white and black inks may be printed two times.

In some embodiments, the optical layer may be formed photolithographically through a photoresist two times.

Figure 4:
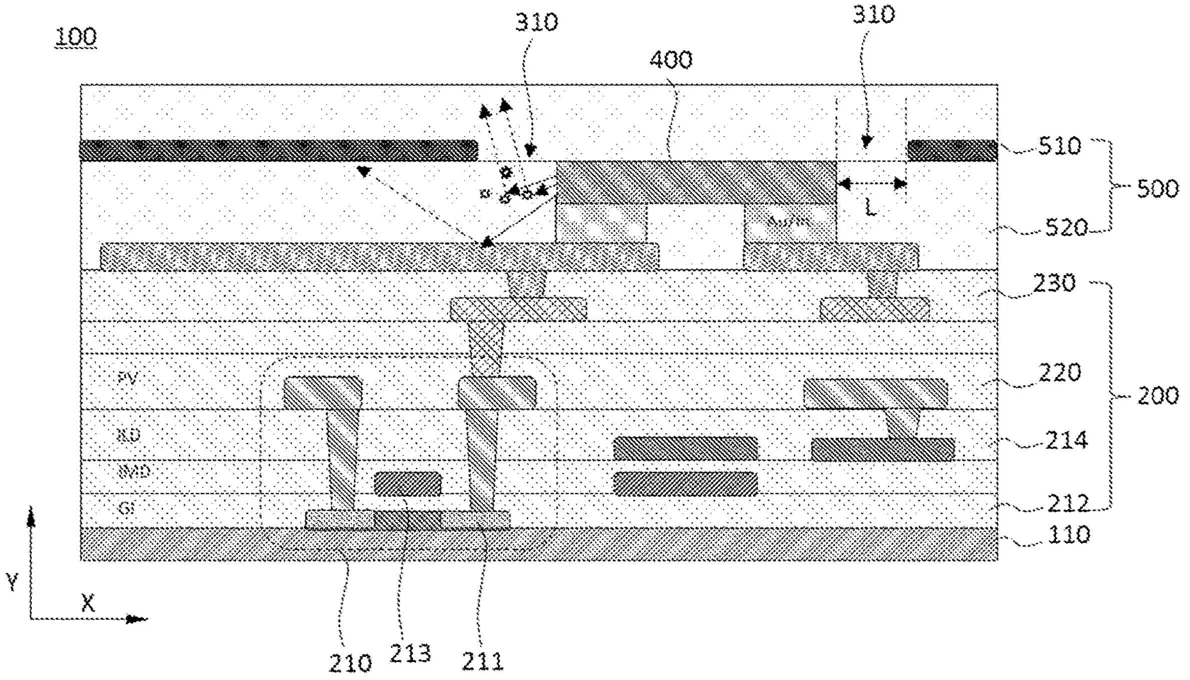
FIG. 4 is another schematic partial cross-section view along the A-A direction of FIG. 1.

FIG. 4 is another schematic partial cross-section view along the A-A direction of FIG. 1. The similarities between FIG. 4 and the above embodiments are not repeated.

In some embodiments, a first gap 310 is formed between the first optical layer 510 and the light-emitting device 400.

The first gap 310 exposes at least a part of the second optical layer 520.

The first optical layer 510 is not in contact with the light-emitting device 400. A gap between the first optical layer 510 and the light-emitting device 400 is the first gap 310.

In some embodiments, the orthographic projection of the first optical layer 510 on the plane where the display panel 100 is located does not overlap with the orthographic projection of the light-emitting device 400 on the plane where the display panel 100 is located, and a gap remains between the orthographic projections. The gap is equivalent to an orthographic projection of the first gap 310 on the plane where the display panel 100 is located.

In some embodiments, the orthographic projection of the first gap 310 on the plane where the display panel 100 is located overlaps with the orthographic projection of the second optical layer 520 on the plane where the display panel 100 is located. An area of the second optical layer 520 exposed by the first gap 310 may be closer to and may even be in direct contact with the light-emitting device 400.

In embodiments of the present disclosure, with such a design, the light utilization rate may be improved while the reflection is reduced. On one hand, the second optical layer may reflect a large amount of light of various colors. The second optical layer may have a strong light reflection and reflect the light from the lateral direction and bottom of the light-emitting device to converge the light in a direction of the front view angle to improve the light utilization rate. On the other hand, the second optical layer may also have a good light-shielding effect on the film layer formed by the metal material below. The first optical layer may have a strong light absorption and can absorb the light reflected by the film layer formed by the metal material below and the white layer formed by the metal material below to reduce the reflection effect.

In addition, in embodiments of the present disclosure, the light transmittance of the second optical layer may be relatively low. Thus, light emitted by the light-emitting device in the lateral direction may not be transmitted too far in the first direction in the second optical layer. The second optical layer may have a high reflection ability. Thus, in a region close to the light-emitting device, most of the light emitted in the lateral direction may be diffusely reflected. An arrow as shown in the figure indicates a schematic propagation diagram of the light emitted in the lateral direction in the optical layer. Therefore, the second optical layer may emit more light in a forward direction of the region close to the light-emitting device. The light emitted by the light-emitting device in the lateral direction may be omitted. Thus, a problem of the reflected light in the region may be desired to be solved. Therefore, the second optical layer may correct the light emitted in the later direction in time by using its feature. The first gap is arranged at a position close to the light-emitting device to provide an exit path for the light after the correction of the second optical layer. In addition, the first optical layer may shield the light reflected by the metal below. The first optical layer may assist to prevent the crosstalk and halo because the light transmission position of the second optical layer for the light emitted from a sidewall of the light-emitting device is too far away from the light-emitting device. As a result, the first optical layer and the second optical layer each may function in regions with different key problems to improve the light utilization rate while reducing the reflection and improve the light-emitting type of the light-emitting device.

In some embodiments, the total OD after the superposition of the first optical layer 510 and the second optical layer 520 may be greater than 1. That is, the total transmittance after the superposition of the first optical layer 510 and the second optical layer 520 may be less than 10%.

In some embodiments, both the first optical layer 510 and the second optical layer 520 may be made of materials with low light transmittance. The OD values of the first optical layer 510 and the second optical layer 520 may both be greater than 1. That is, the transmittances of the first optical layer 510 and the second optical layer 520 may be less than 10%. Therefore, the light reflected by the film layer formed by the metal material under the optical layer may be prevented from being transmitted from the light-emitting surface of the display panel through the optical layer and affecting the display effect.

In some embodiments, the second optical layer 520 may include white nanoparticles such as titanium dioxide ($TiO_2$).

With such a design, the probability of diffuse reflection of the light emitted by the light-emitting device 400 in the second optical layer 520 can be increased. Thus, the propagation direction of more light emitted from the light-emitting device 400 in the lateral direction may be changed. Hence, the propagation direction of the light may shift to the direction toward the light-emitting surface of the display panel (i.e., a direction from the second optical layer toward the first optical layer) to be emitted.

In some embodiments, the first gap is a gap in a closed ring shape or a non-closed ring shape (e.g., a ring with a breakpoint) surrounding the light-emitting device. Thus, the light-emitting effect of the light-emitting device may be improved in various directions, and the halo may be avoided. A radius of an outer contour of the ring shape minus a radius of an inner contour of the ring shape is the width of the ring shape.

Figure 5:
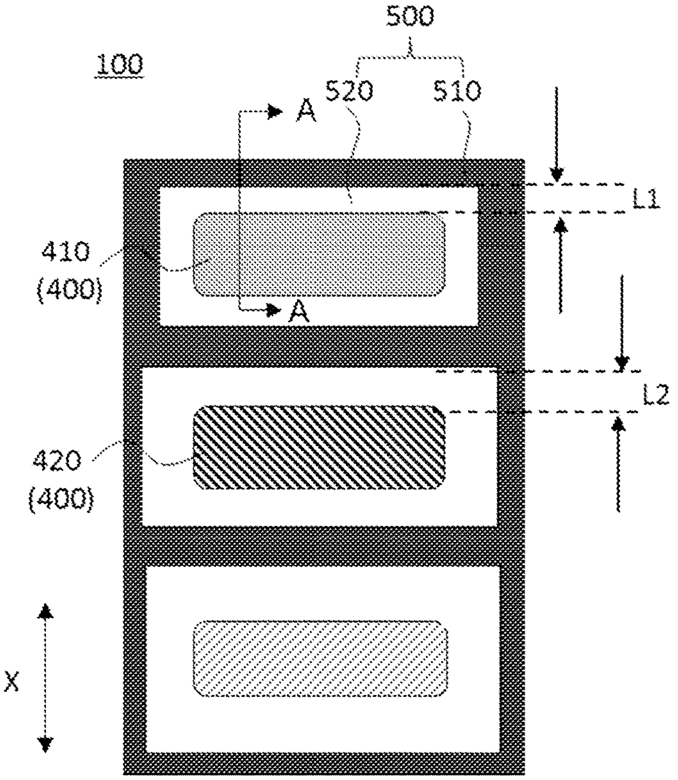
FIG. 5 is a partial schematic top view of a display panel according to some embodiments of the present disclosure.

FIG. 5 is a partial schematic top view of a display panel according to some embodiments of the present disclosure. For a partial cross-section view along the A-A direction in FIG. 5, references may be made to FIG. 4.

In some embodiments, a maximum dimension of a first gap 310 may be Lmax.

Lmax=log (light intensity of the light-emitting device)/unit OD value of the second optical layer That is, the dimension L of the first gap 310 in a direction from the light-emitting device 400 toward the first optical layer 510 (i.e., the width of the first gap 310) may range from 0 to Lmax.

In some embodiments, the brightness of the light-emitting device mentioned in the above formula may be the brightness of the side surface of the light-emitting device.

In some embodiments, the unit OD value mentioned in the above formula may refer to an OD value per micrometer in the thickness of the second optical layer.

In embodiments of the present disclosure, the inventor may obtain the distance that the light-emitting device can penetrate in the second optical layer according to an experiment, and calculate a distance range in which the second optical layer may have a good effect of changing the light of the light-emitting device. That is, a radiation range of the light emitted by the light-emitting device in the lateral direction may be limited in the second optical layer. Thus, the second optical layer at a position far away from the light-emitting device may not have the light emitted from the sidewall of the light-emitting device or such light can be neglected. The problem of the reflected light in this area may need to be solved more urgently. Therefore, with the dimension design of the first gap, the first optical layer and the second optical layer may complement each other. The first optical layer and the second optical layer can avoid mutual impact between the two film layers.

For example, the first optical layer with a sufficient area can avoid reflected light. The first gap is necessary to have between the first optical layer and the light-emitting device, which can allow the second optical layer to function. Thus, when the first gap ranges from 0 to Lmax, the utility of the optical layer formed by the first optical layer and the second optical layer may be enlarged. Meanwhile, the second optical layer with low transmittance may also help to improve the shielding of the reflected light from the underlying metal by the first optical layer. The first optical layer may assist to avoid the crosstalk or halo due to that the light-emitting position of the second optical layer for transmitting the light emitted from the sidewall of the light-emitting device is too far away from the light-emitting device.

In some embodiments, the total OD after the superposition of the first optical layer 510 and the second optical layer 520 may be greater than 1. That is, the total transmittance after the superposition of the first optical layer 510 and the second optical layer 520 may be less than 10%.

In some embodiments of the present disclosure, the OD values of the first optical layer and the second optical layer may be both greater than 1. That is, the transmittances of the first optical layer and the second optical layer may be less than 10%. The reflectivity of the second optical layer 520 may be greater than 50%.

The second optical layer with the high reflectivity and low transmittance may change the optical path of the light emitted by the light-emitting device in the lateral direction in the area close to the sidewall of the light-emitting device, reduce the width of the first gap, increase the shielding area of the first optical layer, and ensure the reflection reduction effect of the optical layer. Further, the direction of the light emitted by the light-emitting device in the lateral direction may be changed as quickly as possible to cause the position when the light is changed to be closer to the light-emitting device. Thus, the light-emitting position of the light may be closed to the light-emitting position of other normal forward emitted light to better avoid the problem of the pixel crosstalk and halo.

In some embodiments of the present disclosure, in a width direction of the first gap, the maximum dimension of the second optical layer exposed by the first optical layer may be Lmax. Lmax=log (light intensity of the light-emitting device)/unit OD value of the second optical layer. Thus, the second optical layer exposed by the first optical layer may be ensured to have sufficient space to improve the optical path.

With reference to FIG. 5, In some embodiments, the light-emitting device 400 includes a first light-emitting device 410 and a second light-emitting device 420.

The dimension of the first gap corresponding to the first light-emitting device 410 is L1.

The dimension of the first gap corresponding to the second light-emitting device 420 is L2.

L1 is smaller than L2. A wavelength of color light corresponding to the first light-emitting device 410 may be smaller than a wavelength of color light corresponding to the second light-emitting device 420.

The dimension of the first gap 310 may refer to the dimension of the first gap 310 in a direction from the corresponding light-emitting device 400 toward the corresponding first optical layer 510, that is, the width of the first gap 310.

The inventors of the present disclosure have found that the transmittance of light with different wavelengths in the second optical layer 520 is different. Therefore, with the above design, the first gap may be matched with light-emitting devices of different colors to avoid differences in light types of light-emitting devices of different colors to be too great.

Figure 21:
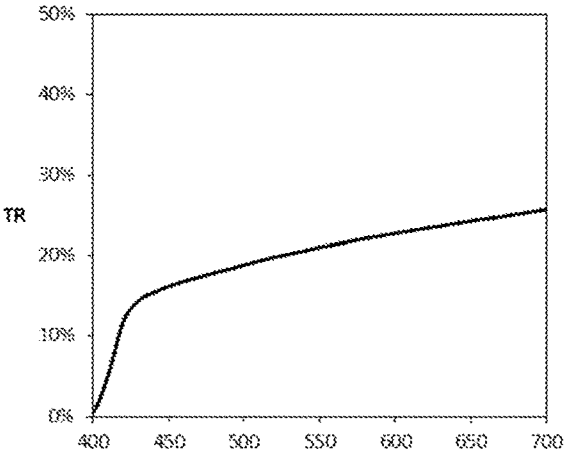
FIG. 21 is a schematic diagram of experimental data according to some embodiments of the present disclosure.

In some embodiments, the second optical layer 520 may be a white film layer. As shown in FIG. 21, FIG. 21 shows data obtained by the inventor according to the experiment of the present disclosure. An abscissa of the line diagram in FIG. 21 is a wavelength of light, and an ordinate is transmittance of light in the second optical layer. Transmittance of light with a wavelength in a range of 400 nm to 460 nm in the second optical layer may be low. That is, the propagation distance of the light in the wavelength range of 400 nm to 460 nm in the white film layer may be shorter than a propagation distance of light in another wavelength range. Therefore, for a light-emitting device that emits light having a wavelength exceeding the wavelength range, a wider first gap may be arranged. Thus, the light type difference between the light-emitting devices that emit light within the wavelength range may be complemented. The light-emitting device that emits light within the wavelength ranging from 400 nm to 460 nm may reduce the width of the first gap. Thus, the second optical layer may not be lost to improve the amount of light emitted in the forward direction. Further, the first optical layer with a sufficient area may be obtained to reduce the reflection.

In some embodiments, the first light-emitting device 410 may include a blue light-emitting device, and the second light-emitting device 420 may include a green light-emitting device or a red light-emitting device. A wavelength of blue light ranges basically from 400 nm to 460 nm. Thus, in some embodiments, Lblue is smaller than Lgreen, or Lblue is smaller than Lred.

Figure 6:
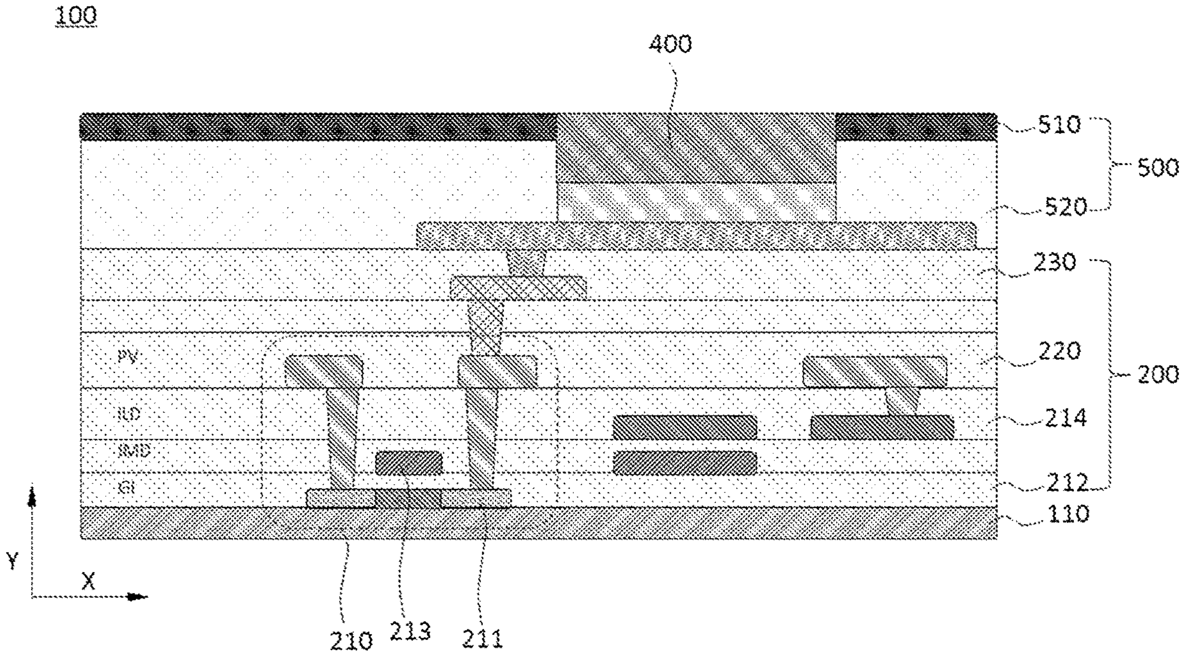
FIG. 6 is another schematic partial cross-section view along the A-A direction of FIG. 1.

In some embodiments of the present disclosure, FIG. 6 is another schematic partial cross-section view along the A-A direction of FIG. 1. The light-emitting device 400 may include an organic light-emitting diode (OLED).

In some embodiments, the light-emitting device may be a Micro Light-emitting Diode (Micro-LED). The size of the Micro-LED may be smaller than 100 By using the Micro-LED as the light-emitting device 400, the life of the display panel may be effectively improved, the power consumption of the display panel may be reduced, the response time of the display panel may be shortened, and the view angle of the display panel may be increased.

Moreover, by using the Micro-LED as the light-emitting device 400, the optical layer 500 may be shaped by using the Micro-LED to pattern the optical layer 500. In some embodiments, when the optical layer 500 is formed by covering a corresponding position of the array layer 200 with ink, an adhesive film, or PR photoresist by printing, scraping film, or PR coating, the Micro-LED as the light-emitting device 400 may be used as a barrier and to shape the optical layer.

In embodiments of the present disclosure, the light-emitting device 400 is taken as a Micro-LED for example. The present disclosure is described by taking the light-emitting device as a flip-chip Micro-LED chip as an example. In embodiments of the present disclosure, the light-emitting device may be a vertical Micro-LED chip.

In some embodiments, a connection electrode connected to the pixel circuit may be arranged on the array layer. The connection electrode may be a metal connection member. The metal connection member may be arranged on a most outer layer of the array substrate or exposed by the insulation layer on the array substrate. Thus, the metal connection member may be in contact with an electrode layer made of the Micro-LED that is transported to the array substrate. In some embodiments, the metal connection member of the array layer may be melted to form a eutectic structure (eutectic layer) with the electrode layer made of the Micro-LED to realize an electrical connection between the Micro-LED and the array layer (pixel circuit).

In some embodiments, the optical layer may at least cover the metal connection member on the array layer exposed by the light-emitting device.

The inventor of the present disclosure has found that Micro-LED die may be bonded to the metal connection member on the array layer 200 through the eutectic layer.

The metal connection member and the metal circuit on the array layer may have a high reflection of external ambient light, which may cause light crosstalk, form a halo, and affect the display effect.

In embodiments of the present disclosure, on one hand, Since the light-emitting device by using the Micro-LED has good water and oxygen resistance, the Micro-LED may be formed on the array layer first, and then the optical layer may be prepared. The Micro-LED may assist to pattern the optical layer, such as blocking the overflow of the optical layer material. On the other hand, according to the above analysis, the optical layer may prevent the light reflected by the metal connection member from being emitted from the light-emitting surface of the display panel to affect the display effect.

Figure 7:
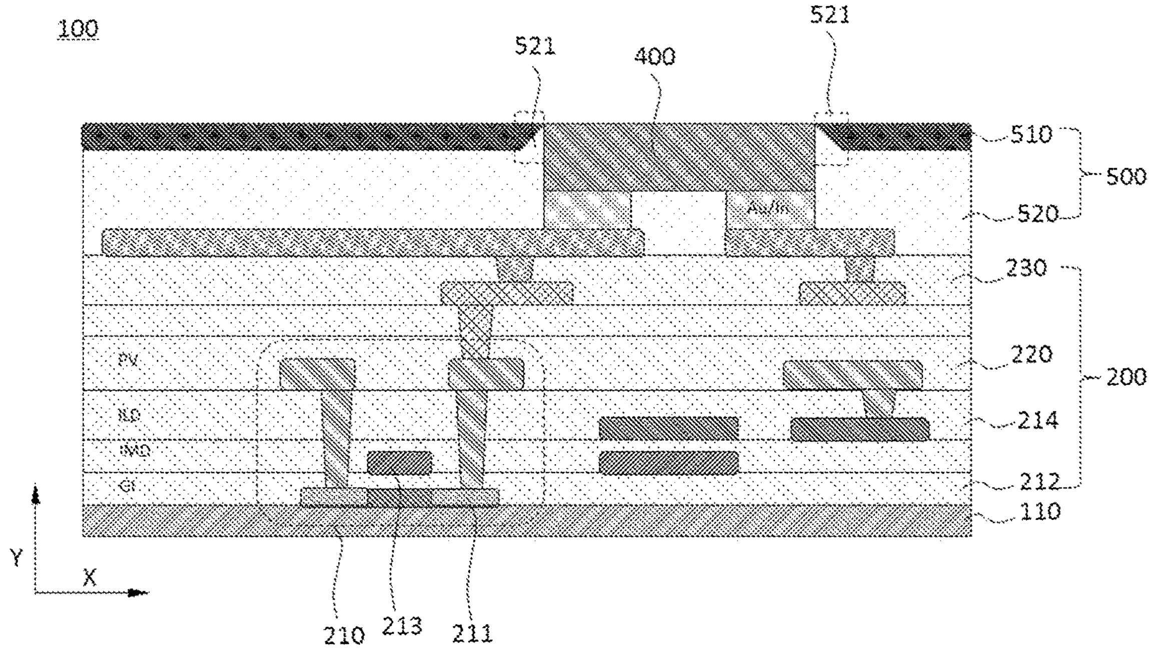
FIG. 7 is another schematic partial cross-section view along the A-A direction of FIG. 1.

FIG. 7 is another schematic partial cross-section view along the A-A direction of FIG. 1.

In some embodiments, the optical layer 500 may climb a slope along the sidewall of the light-emitting device 400. The optical layer (which may be a sub-layer of the optical layer) that climbs a slope may have a height at a slope position higher than a height at a non-slope position. That is, a distance from a top surface of the optical layer at the slope position to the substrate 110 in the second direction Y may be greater than a distance from a top surface of the optical layer at the non-slope position to the substrate 110 in the second direction Y.

In embodiments of the present disclosure, due to the surface tension and the Micro-LED light-emitting device, the optical layer at the sidewall of the Micro-LED may easily form a slope. The slope may perform bank light reception in a lateral direction of the Micro-LED to improve light efficiency.

In some embodiments, the optical layer 500 includes a first optical layer 510 and a second optical layer 520 stacked in sequence along a direction from the array layer 200 to the substrate 110. For other features of the first optical layer 510 and the second optical layer 520 of embodiments of the present disclosure, references may be made to other embodiments of the present disclosure, which is not repeated here.

In some embodiments, the second optical layer 520 may climb a slope along the sidewall of the light-emitting device 400. A position surrounded by a dotted frame in the figure is the slope position 521 in the second optical layer 520.

The first optical layer 510 may overlap the second optical layer 520 at the slope position 521.

In some embodiments, the first optical layer 510 and the second optical layer 520 at the slope position 521 may overlap in the first direction X, and also in the second direction Y.

In some embodiments, the height of the second optical layer 520 may gradually decrease in a direction from the sidewall of the light-emitting device 400 to a direction away from the optical layer of the light-emitting device 400 to form a downward slope. The first optical layer 510 may at least partially cover the slope.

In some embodiments, the thickness of the first optical layer 510 covering the slope position 521 may be reduced in the second direction Y.

In some embodiments, the first optical layer 510 may include a black layer. The second optical layer 520 may include a white layer.

By attaching the white second optical layer 520 to the sidewall of the Micro-LED, the second optical layer 520 may form a slope angle, which may indirectly thin the black first optical layer 510 in the area close to the Micro-LED. Since the light amount close to the light emitted in the forward direction obtained after the direction change at the area of the second optical layer close to the Micro-LED is high, more of the light close to the Micro-LED may be emitted out after the optical path is improved. Thus, the reflectivity may be reduced significantly and the light amount emitted in the forward direction may be increased.

As shown in FIG. 2 or FIG. 4, in some embodiments, the top surface of the optical layer 500 may be higher than the top surface of the light-emitting device 400. That is, an opening may be formed at the optical layer 500 to accommodate the light-emitting device, and the light-emitting device 400 may be arranged in the opening. The height of the top surface of the optical layer 500 is higher than the height of the top surface of the light-emitting device 400. The top surface of the optical layer 500 is closer to the light-emitting surface of the display panel 100 than the top surface of the light-emitting device 400. A height of a certain structure may refer to a distance from the structure to a plane where the substrate is located along a direction perpendicular to a plane where the display panel is located. In embodiments of the present disclosure, the light-emitting device may be placed in the opening of the optical layer, which will not block the top surface of the light-emitting device, and improve the light emitted from the top surface of the light-emitting device with a large view angle or in the lateral direction. The light amount emitted from the front surface of the light-emitting device may be increased to reduce the crosstalk and halo.

In some embodiments, an upper surface of the optical layer 500 may be flush with or higher than an upper surface of the light-emitting device.

In some embodiments, along a direction perpendicular to the plane where the display panel 100 is located, a total thickness of the second optical layer 520 may range from 10 to 15 μm.

In some embodiments, the optical layer 500 may include an organic material, such as an ink layer or an adhesive layer. Such a material may form a film layer with a certain thickness requirement, and further, the ink layer and the adhesive layer may have a certain fluidity. Thus, such a material may have a certain surface tension, and a top surface of the material may be slightly higher than a top surface of the light-emitting device when the light-emitting device blocks the overflow of the material. Therefore, structural requirements for improving the optical effect of the optical layer may be better met.

Figure 8:
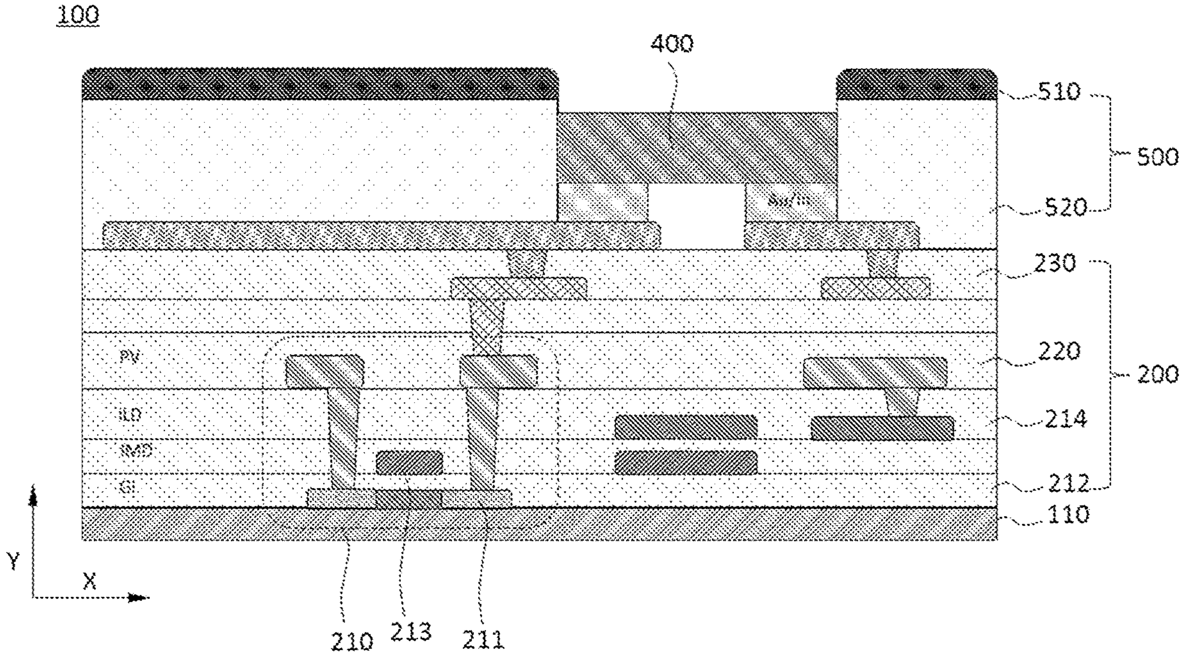
FIG. 8 is another schematic partial cross-section view along the A-A direction of FIG. 1.

FIG. 8 is another schematic cross-section view along the A-A direction of FIG. 1.

In some embodiments, the optical layer 500 includes the first optical layer 510 and the second optical layer 520 above.

In some embodiments, the height of the second optical layer 520 may be greater than a height of a light-emitting device 400.

That is, the opening formed at the second optical layer may accommodate the light-emitting device. The light-emitting device may be placed in the opening. The height of the top surface of the second optical layer may be higher than the height of the top surface of the light-emitting device. The top surface of the second optical layer may be closer to the light-emitting surface of the display panel than the top surface of the light-emitting device. A height of a certain structure may refer to a distance from the structure to the plane where the substrate is located along a direction perpendicular to the plane where the display panel is located. In embodiments of the present disclosure, the light emitted from the side surface of the light-emitting device may be sufficiently improved by the second optical layer, and the light amount emitted in the forward direction of the light-emitting device may be further improved.

In some embodiments, a total thickness of the second optical layer 520 may range from 10 to 15 μm. Thus, the light utilization rate may be improved while the reflection is reduced, and light may not be leaked too much to cause crosstalk.

In some embodiments, along the direction perpendicular to the plane where the display panel 100 is located, the distance from the top surface of the second optical layer 520 to the plane where the substrate 110 is located may range from 10 μm to 15 μm greater than the distance from the light-emitting device 400 to the plane where the substrate 110 is located. Thus, the light utilization rate may be improved while the reflection is reduced, and the light may not be leaked too much to cause crosstalk.

In some embodiments, the second optical layer 520 may include an organic material, such as an ink layer or an adhesive layer. Such a material may form a film layer with a certain thickness requirement, and further, the ink layer and the adhesive layer may have a certain fluidity. Thus, such a material may have a certain surface tension, and the top surface of the material may be slightly higher than the top surface of the light-emitting device when the light-emitting device blocks the overflow of the material. Therefore, structural requirements for improving the optical effect of the optical layer may be better met.

Figure 9:
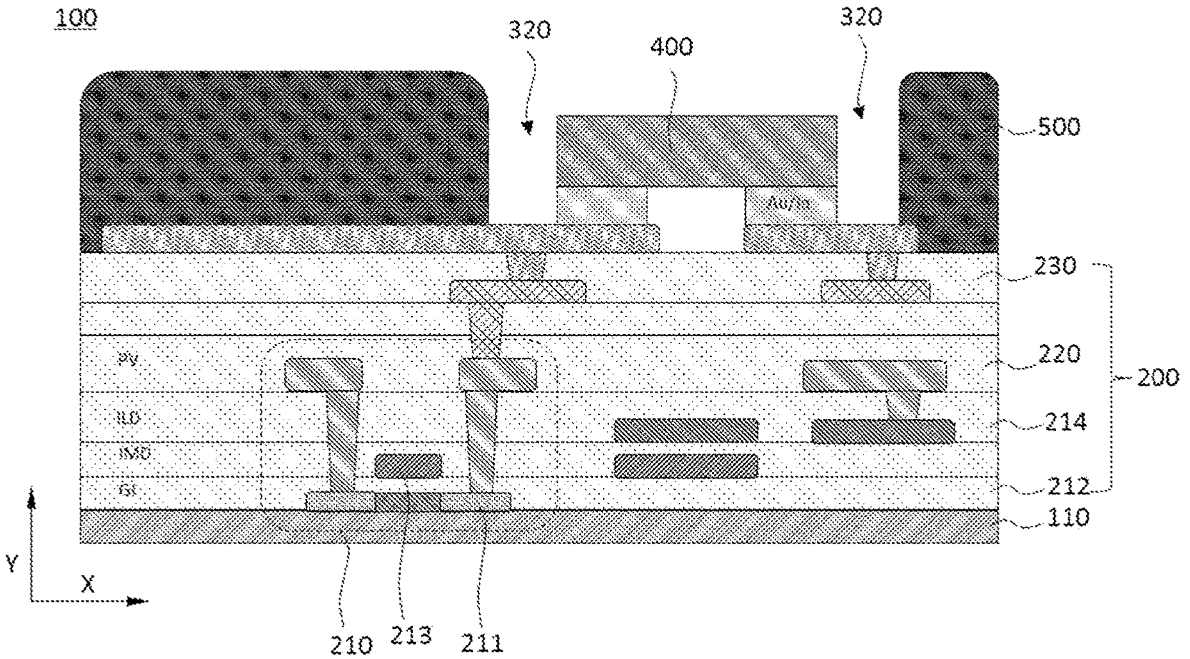
FIG. 9 is another schematic partial cross-section view along the A-A direction of FIG. 1.

FIG. 9 is another schematic cross-section view along the A-A direction of FIG. 1.

In some embodiments, a second gap 320 is formed between an optical layer 500 and a light-emitting device 400.

In some embodiments, the optical layer 500 is not in direct contact with the light-emitting device 400. The optical layer 500 and the light-emitting device 400 have the second gap 320. The second gap 320 passes through the optical layer 500 in a direction perpendicular to the plane where the display panel 100 is located. That is, the optical layer 500 ends at an edge of the second gap 320, and two sides of the second gap 320 are formed by the optical layer 500 and the light-emitting device 400, respectively.

In embodiments of the present application, the second gap may be a gap in a closed ring shape or a non-closed ring shape (e.g., a ring with a breakpoint) surrounding the light-emitting device. Thus, the light-emitting effect in various directions of the light-emitting device may be improved.

With reference to FIG. 9 again, in some embodiments, the optical layer 500 is a single-layer structure. That is, along the direction perpendicular to the plane where the display panel is located, the optical layer 500 may include a single layer. A film layer material may be the same.

In some embodiments, the optical layer 500 may be made of a material with low light transmittance and low reflectivity. An OD value of the optical layer 500 may be greater than 1. That is, the transmittance of the optical layer 500 may be less than 10%. The reflectivity of the optical layer 500 may be less than 10%.

In some embodiments, the optical layer 500 may include a black film layer.

With such a design, the optical layer 500 and the light-emitting device 400 may have the second gap 320 therebetween. Therefore, the light emitted in the lateral direction may be properly emitted through the second gap. Thus, the problem of insufficient light emitted in the lateral direction may be compensated. Therefore, the optical layer 500 may be a whole black material layer based on a requirement of improving an anti-reflection effect. Based on the requirement of the high anti-reflection effect, a light-emitting rate may be improved, and the crosstalk may be appropriately reduced.

Figure 10:
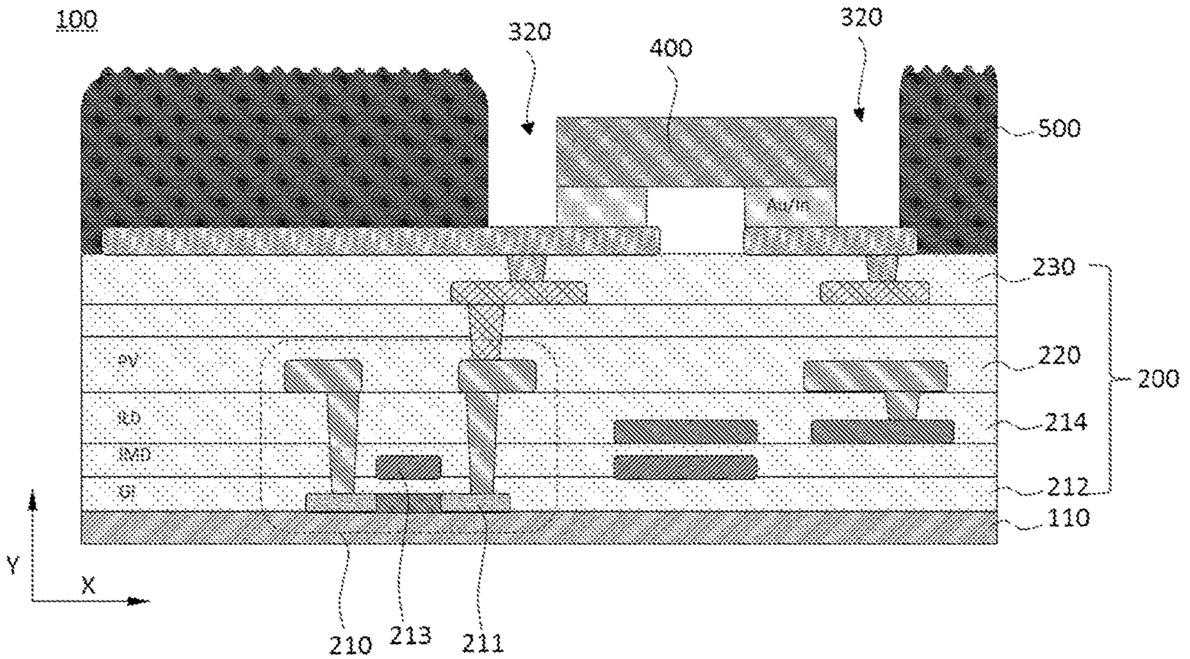
FIG. 10 is another schematic partial cross-section view along the A-A direction of FIG. 1.

FIG. 10 is another schematic cross-section view along the A-A direction of FIG. 1.

In some embodiments, a top surface of an optical layer 500 includes a concave-convex structure. That is, a surface of the optical layer facing the light-emitting surface of the display panel may have a rough surface with the concave-convex structure.

In some embodiments, an upper surface of the optical layer 500 may be patterned and printed to form the concave-convex structure 700 to reduce mirror reflection. In some embodiments of the present disclosure, the optical layer may have a single-layer structure. The concave-convex structure may be formed on the entire top surface of the optical layer.

Figure 11:
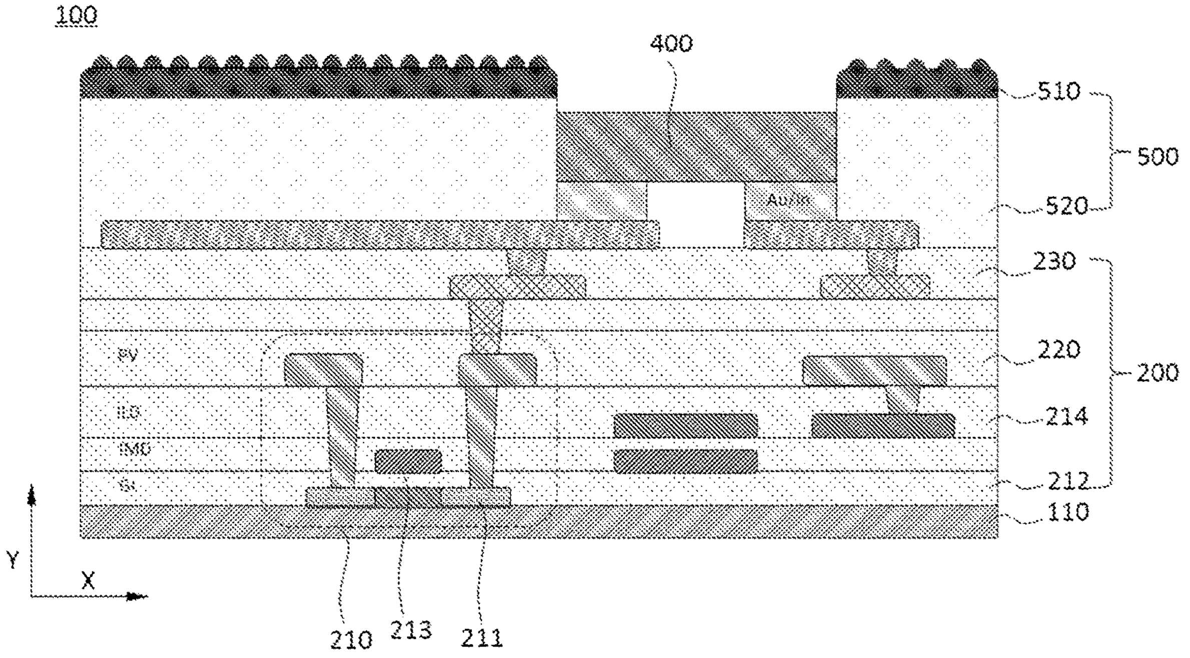
FIG. 11 is another schematic partial cross-section view along the A-A direction of FIG. 1.

In some other embodiments of the present disclosure, the optical layer may include a plurality of sub-layers. The concave-convex structure may be formed on the top surface of the entire optical layer. That is, the concave-convex structure may be formed on a top surface of the sub-layer on the side of the optical layer closest to the light-emitting surface of the display panel. FIG. 11 is another schematic partial cross-section view along the A-A direction of FIG. 1.

In some embodiments, an optical layer 500 includes a first optical layer 510 and a second optical layer 520 stacked in sequence along a direction from the array layer 200 to the substrate 110.

In some embodiments, the concave-convex structure is formed on the first optical layer 510. Thus, the mirror reflection may be reduced by the concave-convex structure without affecting a mutual assistant effect of the sub-layers in the optical layer.

Further, for the first optical layer 510 and the second optical layer 520 of embodiments of the present disclosure, references may be made to the first optical layer 510 and the second optical layer 520 described above.

In some embodiments, both the first optical layer 510 and the second optical layer 520 may include materials with low light transmittance. The OD values of the first optical layer 510 and the second optical layer 520 may both be greater than 1. That is, the transmittances of the first optical layer 510 and the second optical layer 520 may be less than 10%.

In some embodiments, the first optical layer 510 may include a black layer. The second optical layer 520 may include a white layer.

In some embodiments, the concavo-convex structure may form the top surface of the black layer to further reduce the reflectivity.

In some embodiments, the first optical layer 510 may include an ink/adhesive film. The ink/adhesive film may be formed by a printing/photoresist film pressing and attaching process. A patterned print may be formed on the top of the black adhesive film to form the concavo-convex structure to reduce the mirror reflection.

Figure 12:
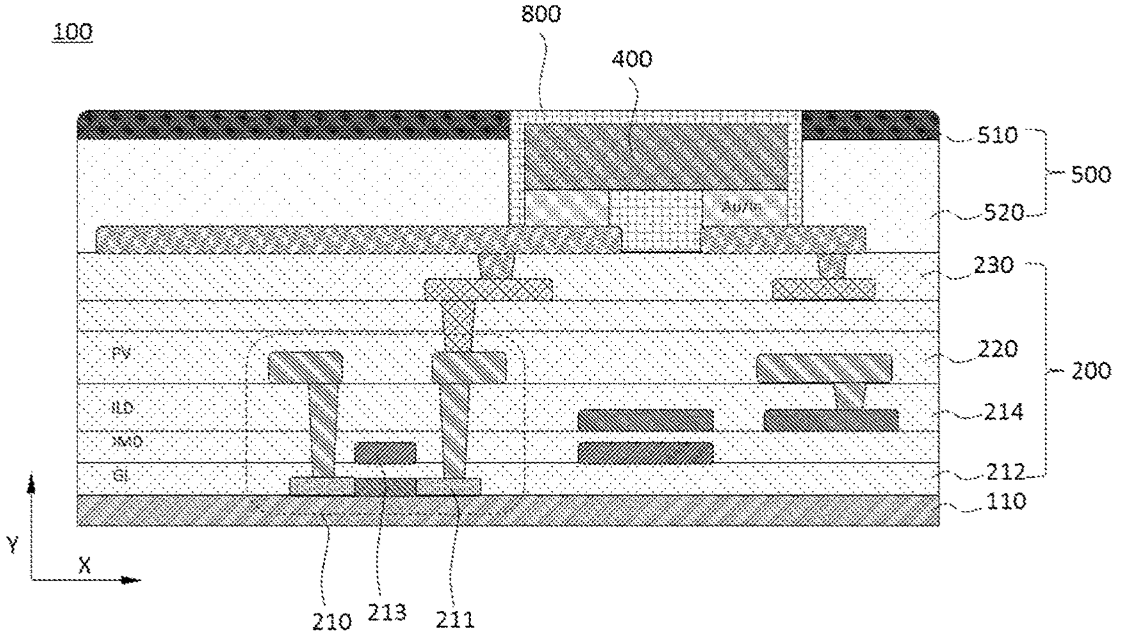
FIG. 12 is another schematic partial cross-section view along the A-A direction of FIG. 1.
Figure 13:
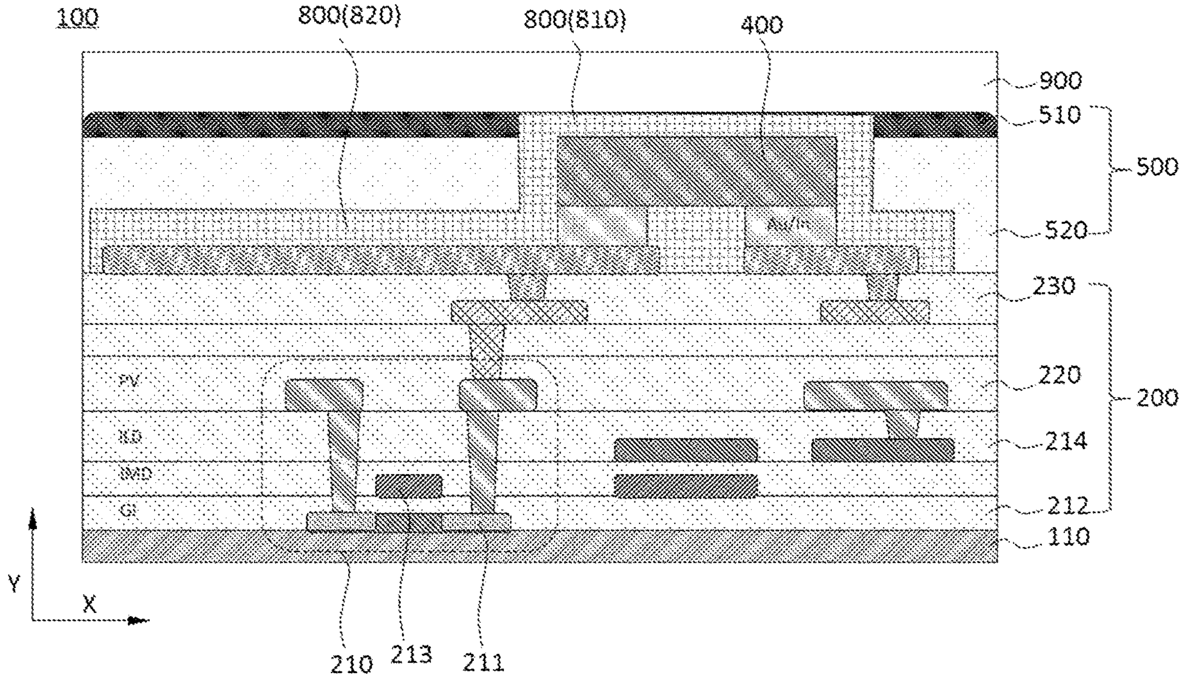
FIG. 13 to FIG. 20 are different schematic partial cross-section views along the A-A direction of FIG. 1.

FIG. 12 is another schematic partial cross-section view along the A-A direction of FIG. 1.

In some embodiments of the present disclosure, the display panel 100 further includes a cover layer 800. The cover layer 800 may be made of a transparent material. The cover layer 800 may cover the light-emitting device 400.

In some embodiments, the cover layer 800 may be equivalent to a packaging layer that encapsulates the light-emitting device 400.

In some embodiments, the light-emitting device 400 may be formed before the optical layer 500. Thus, the optical layer may be blocked.

In some embodiments, the cover layer 800 may be formed before the optical layer 500. That is, in the direction perpendicular to the plane where the display panel is located, the optical layer may not be covered by the cover layer, and the optical layer may partially cover the optical layer. Thus, the problem of the optical layer remaining directly above the light-emitting device can be avoided.

In two structures A and B, A covering B may indicate that A may be located on a side of B facing the substrate, or B may be located under A.

In some embodiments of the present disclosure, the cover layer 800 encapsulates the light-emitting device 400. That is, the cover layer 800 may cover at least the top surface and sidewalls of the light-emitting device to wrap surfaces of the light-emitting device in a plurality of directions.

In some embodiments, a material of the cover layer 800 may reuse a material of the packaging layer.

In some embodiments, the cover layer may encapsulate the light-emitting device at a pixel level. That is, one light-emitting device may correspond to a cover-layer unit. One cover layer unit may cover only one light-emitting device. Cover layer units corresponding to different light-emitting devices may be discontinuous. Thus, the unitized cover layer may be used to further assist in limiting the optical layer.

In some embodiments, the material of the cover layer 800 may be transparent. A refractive index of the cover layer 800 may be between a refractive index of the light-emitting device (e.g., Micro-LED) and a refractive index of a protection layer (e.g., glass). Thus, the light type of the Micro-LED and the view angle brightness may be adjusted through the cover layer with a specific refractive index.

In some embodiments, the height of the optical layer 500 may be greater than the height of the cover layer 800. That is, the height of the top surface of the optical layer 500 may be higher than the height of the top surface of the cover layer 800. The top surface of the optical layer 500 may be closer to the light-emitting surface of the display panel 100 than the top surface of the cover layer 800.

In some embodiments, the light-emitting device 400 may include a Micro-LED. The cover layer 800 may include an encapsulant. A total height of the optical layer 500 (a single layer or a combination of black/white adhesive films) may be greater than or equal to the total height of the Micro-LED and the encapsulant. The light type of the Micro-LED and the view angle brightness may be adjusted through the height of the optical layer and the cover layer.

In some embodiments, the optical layer 500 includes the first optical layer 510 and the second optical layer 520 above.

In some embodiments, the height of the top surface of the second optical layer 520 may be higher than the height of the top surface of the cover layer 800. The top surface of the second optical layer may be closer to the light-emitting surface of the display panel than the top surface of the cover layer. A height of a certain structure may refer to a distance from the structure to the plane where the substrate is located along the direction perpendicular to the plane where the display panel is located. In embodiments of the present disclosure, the light type of the Micro-LED and the view angle brightness may be adjusted through the height of the black and white adhesive films and the cover layer. Thus, the second optical layer and the cover layer may further form better cooperation to increase the light amount emitted in the forward direction of the light-emitting device.

In addition, after the Micro-LED is encapsulated by the cover layer, an upper surface of white ink may be flush with or higher than the upper surface of the Micro-LED to maximize the light efficiency of the Micro-LED. The black film layer is located above the Micro-LED, which may restrict the light type and the view angle brightness of the Micro-LED. An effective design of the light-emitting angle may be achieved through the height of the white and black film layers.

In some embodiments, a distance from an edge of the transparent encapsulant to an edge of the chip may be defined as d, where d is smaller than or equal to L. That is, a sidewall of the light-emitting device 400 may also be covered with the cover layer, for example, the cover layer 800 may encapsulate the sidewall of the light-emitting device 400. A thickness of the cover layer 800 at the sidewall of the light-emitting device 400 may be d (the thickness parallel to the thickness in the first direction X). An interval between the optical layer 500 and the light-emitting device 400 may be L. In some embodiments, L may be a dimension of the first gap between the first optical layer and the light-emitting device. Thus, the second optical layer exposed by the first optical layer may be ensured to have enough space to improve the optical path.

In some embodiments, the thickness of the cover layer on the sidewall of the light-emitting device may range from 5 μm to 10 μm. The thickness may refer to a dimension of the cover layer attached to the sidewall of the light-emitting device in the first direction X. Thus, an encapsulation effect and a function effect of the optical layer may be ensured.

As shown in FIGS. 13 to 16, FIGS. 13 to 14 are different schematic partial cross-section views along the A-A direction of FIG. 1.

In some embodiments, a cover layer 800 includes a first region 810 and a second region 820.

In some embodiments, the first region 810 covers the light-emitting device 400. That is, in a direction perpendicular to the plane where the display panel 100 is located (i.e., the second direction Y), a projection of the first region 810 may cover a projection of the light-emitting device 400.

In some embodiments, the second region 820 is covered by the optical layer 500. That is, in the direction perpendicular to the plane where the display panel 100 is located (i.e., the second direction Y), a projection of the second region 820 may overlap a projection of the optical layer 500.

In some embodiments, the first region 810 and the second region 820 may be continuous structures. The first region 810 and the second region 820 may together form a pixel-level packaging structure to package a light-emitting device and a peripheral region of the light-emitting device.

In some embodiments, an orthographic projection of the second region 820 on the substrate 110 may surround an orthographic projection of the first region 810 on the substrate 110.

In some embodiments, the first region 810 may be higher than the second region 820. That is, the top surface of the first region 810 may be higher than the top surface of the second region 820. That is, in embodiments of the present disclosure, thicknesses of the first region 810 and the second region 820 may not be required to be different in the second direction Y, but the height of the top surface of the first region 810 may be required to be higher than the height of the second region 820. That is, the top surface of the first region 810 may be closer to the light-emitting surface of the display panel 100 than the top surface of the second region 820. A height of a certain structure may refer to a distance from the structure to the plane where the substrate is located along the direction perpendicular to the plane where the display panel is located.

In some embodiments, the cover layer may be patterned by a Halftone process. Thus, the cover layer may be patterned once to form the first region and the second region with different heights. In some other embodiments, the cover layer may be packaged twice to form a step.

In embodiments of the present disclosure, the light-emitting device may be placed on the array layer before the optical layer is formed. In order to avoid the influence of an optical layer (i.e., black and white ink/adhesive film) preparation process on the light-emitting device, and improve reliability, the Halftone process may be performed. Thus, the light-emitting device may be encapsulated, and another metal film layer exposed by the array layer may be protected by the second region, e.g., the metal connection member on the array layer that supports the light-emitting device. A secondary level difference may be formed at a junction of the first region and the second region (a primary level difference is a level difference formed by the second region and the underlying film layer of the second region) to leave a sufficient thickness for black/white ink or adhesive film. That is, because the material of the optical layer has a certain fluidity, the material may be set at intervals corresponding to the light-emitting devices during preparation. The intervals between the light-emitting devices may be filled automatically due to the fluidity of the material. However, due to the uncontrollability of self-filling, a second optical layer thickness in some region may not be able to achieve the requirement, or the material may be missing. Thus, in embodiments of the present disclosure, the second region may increase the optical layer to reduce the amount of the material of the optical layer required here. The problem that the material is missing in the region of the optical layer close to the light-emitting device may be avoided. The step may be formed by a portion of the first region higher than the second region. A sidewall of the step may block the optical layer to prevent the optical layer from overflowing. In addition, the secondary level difference may be used to effectively reduce the adhesive film remaining on the surface of the light-emitting device. Slight residual may be removed together with the encapsulant by ashing.

In some other embodiments of the present disclosure, the second region may be obtained by extending the cover layer from the first region to the periphery of the light-emitting device. Since the first region is located on the light-emitting device, when the cover layer extends from the first region to the periphery of the light-emitting device, a fluctuation at the outer contour of the light-emitting device may be formed at the sidewall where the cover layer is attached to naturally form the secondary level step.

In some embodiments, a position where the primary level step ends, that is, a coverage range of the second region may be selected as needed, may be subjected to a position where the packaging can be completed. For example, the second region may cover a thin-film transistor (TFT) device and the metal connection member on the array layer that supports the light-emitting device.

Figure 14:
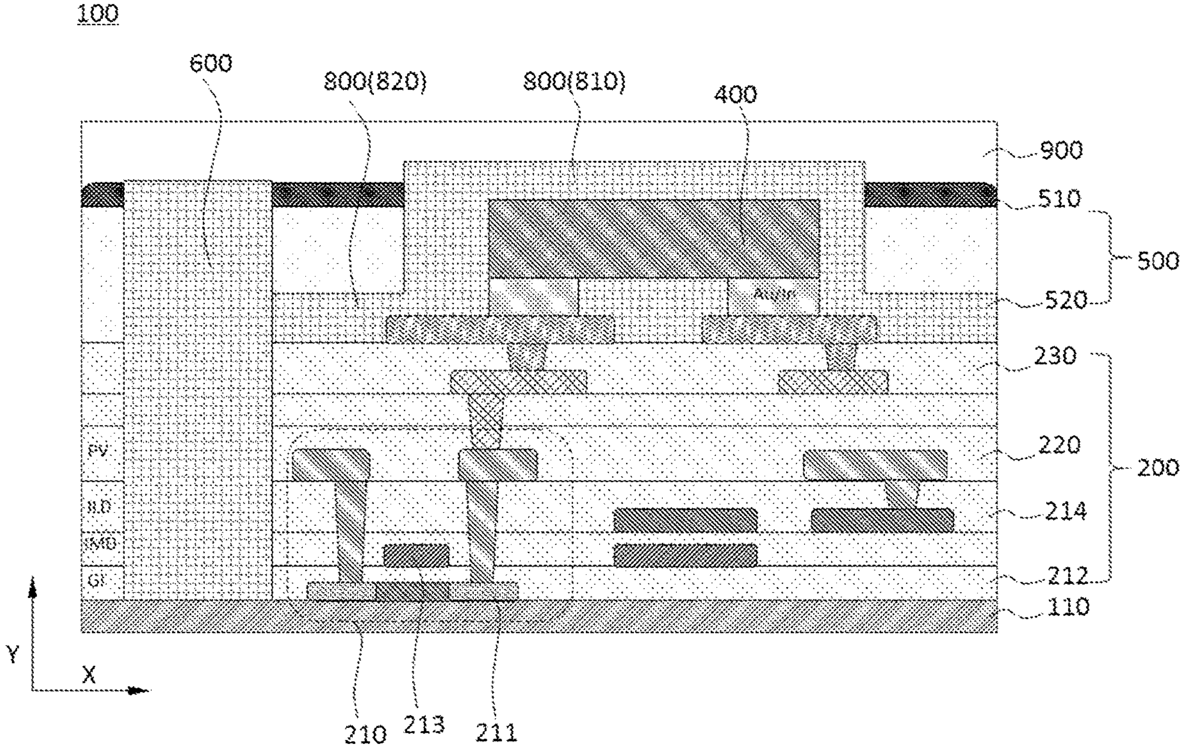
Figure 15:
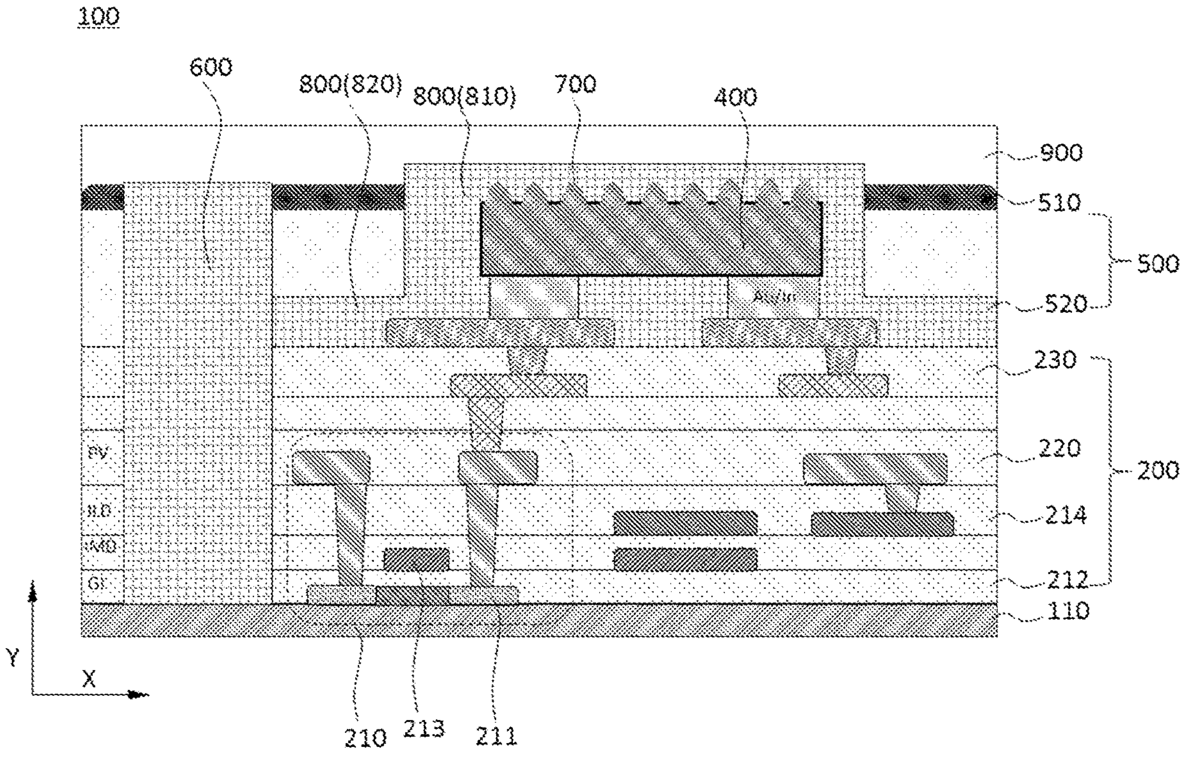
Figure 16:
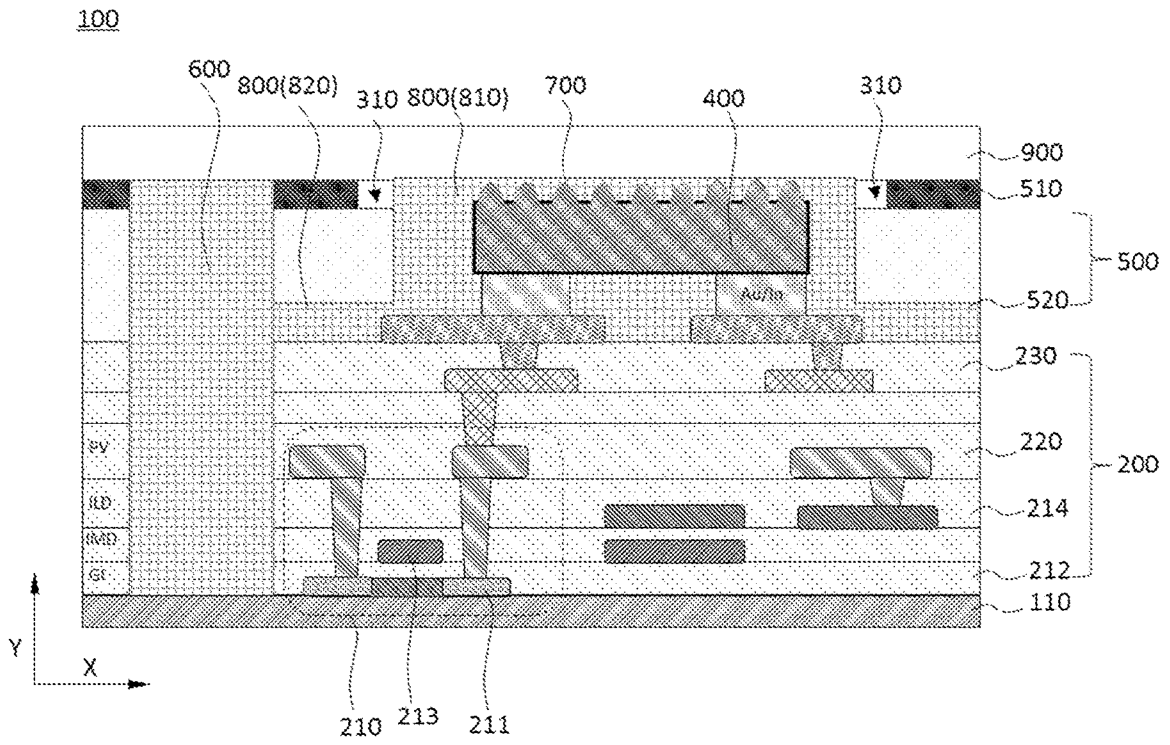

Wither still reference to FIG. 14, in some embodiments, the array layer 200 includes a light-transmission region 600. An in-screen hole-digging technology may be performed on the display panel. That is, the light-transmission region corresponding to a light-sensing device such as a camera and a fingerprint recognition sensor may be arranged in the effective display area. For example, an opening may be cut in the array layer to cause the camera originally at a frame region to be arranged in an overlap region with the display region. Thus, the frame region may be reduced to realize a full display. In some embodiments, an insulation layer (e.g., a gate insulation layer 212, an interlayer insulation layer 214, a passivation layer 220, etc.) in the light-transmission region of the array layer may have a hollow design. The hollow may extend to the substrate 110. Thus, the insulation layer may have a relatively high light transmittance to form the light-transmission region 600. In some embodiments of the present disclosure, the hollow may also open up the substrate, which is not repeated here. In some other embodiments of the present disclosure, the above processing may be performed as described on various regions of the display region or a whole region except a region that needs to be kept to form the transparent display panel.

In some embodiments, the light-transmission region 600 may be filled with a light-transmission material. That is, the material filled in the hollow may be the light-transmission material.

In some embodiments, the light-transmission material filled in the cover layer 800 and the light-transmission region 600 may be on a same layer and include a same material. That is, filling the material in the light-transmission region may be performed as a same step as the cover layer.

In some embodiments, the light-transmission material filled in the cover layer 800 and the light-transmitting region 600 may include a transparent encapsulant.

In some embodiments, the light-transmission material filled in the cover layer 800 and the light-transmission region 600 may be formed continuously and integrally.

The inventors of the present disclosure have found that, for the under-screen camera or transparent display technology, forming the light-transmission region includes performing the hollow processing on the array layer. A segment difference may exist at a hollowed position and non-hollowed position in the array layer after the hollow process. Thus, ink or adhesive film may remain in the segment difference after the optical layer is prepared. Therefore, after the light-emitting device is prepared, e.g., after the Micro-LED is bonded, the light-transmission region and the Micro-LED may be packaged by the encapsulant for protection first. Then, the white and block ink/adhesive film may be prepared to form the optical layer. Thus, the material residual may be avoided. Since the materials of the two structures are in a same step and a same material, the preparation process of the display panel may be simplified, and the cost may be reduced.

FIGS. 15 to 20 are different schematic partial cross-section views along the A-A direction of FIG. 1.

In some embodiments, a top surface of a light-emitting device 400 includes a concave-convex structure 700. In some embodiments, the concave-convex structure 700 is formed on a side surface of the light-emitting device 400 facing the light-emitting surface of the display panel 100.

In some embodiments, the light-emitting device 400 may include a Micro-LED.

In some embodiments, As shown in FIGS. 15 to 19, the display panel 100 further includes a cover layer 800. The cover layer 800 covers at least the top surface of the light-emitting device 400 and the concave-convex structure 700. That is, an orthographic projection of the cover layer 800 on the plane where the display panel is located may cover an orthographic projection of the light-emitting device 400 on the plane where the display panel is located.

In some embodiments, the cover layer 800 may be formed before the optical layer 500. That is, in the direction perpendicular to the plane where the display panel is located, the cover layer may not cover the optical layer, and the optical layer may cover a portion of the optical layer. In two structures A and B mentioned here, A covering B may indicate that A is located on a side of B facing the substrate, or B is located under A.

In order to improve the light-emitting rate of the Micro-LED, in some embodiments, the concave-convex structure, that is a PSS structure or a micro-prism structure, may be arranged on the upper surface of the Micro-LED. Thus, the light-emitting device may have a rough surface and break total reflection of the surface. However, the inventors of the present disclosure have found that the optical layer formed by the black/white adhesive film may be likely to remain on the PSS structure to reduce the light efficiency. Therefore, by covering the light-emitting device with the cover layer, a process of patterning the optical layer may be optimized, which can avoid the remaining optical layer on the PSS structure and ensure light efficiency. In addition, since the cover layer is raised with height, the covering layer may have a better effect of shaping or blocking the optical layer to prevent the optical layer from overflowing.

As shown in any one of FIG. 13 to FIG. 16 and FIG. 19, in some embodiments, the display panel 100 further includes a protection layer 900 formed on a side of the optical layer 500 away from the array layer 200.

In some embodiments, the cover layer 800 may be in contact with the protection layer 900.

In some embodiments, a difference between a refractive index of the cover layer 800 and a refractive index of the protection layer 900 may be less than 0.5.

In some embodiments, a refractive index of the cover layer and a refractive index of the protection layer may both range from 1 to 1.7 (e.g., 1.5).

In some embodiments, the protection layer 900 may be a glass cover board, i.e., Cover Glass. Then, the refractive index of the cover layer 800 may be equal to the refractive index of the protection layer.

The light type of the Micro-LED and the view angle brightness may be adjusted through the cover layer with a specific refractive index.

Figure 19:
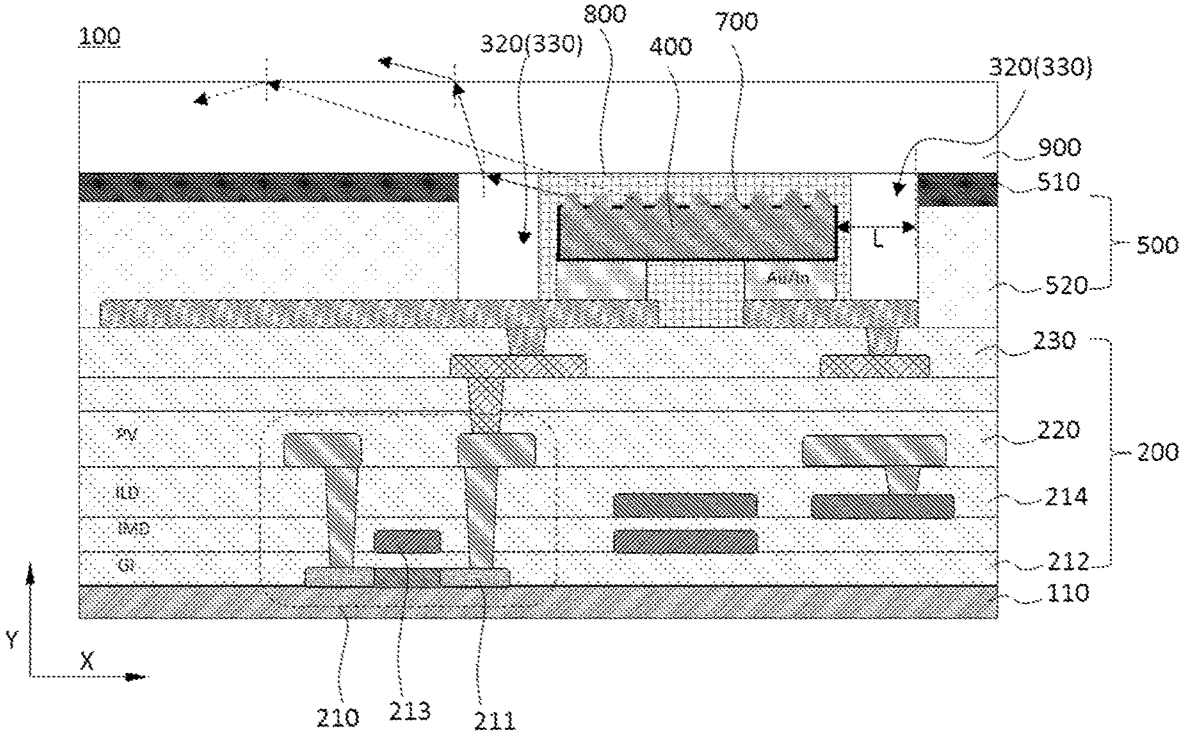

In addition, as shown in FIG. 19, since the Micro-LED is capsulated by glass, no air gap exists, and light with a large view angle is totally reflected inside the glass (indicated by a dotted arrow in FIG. 19). Thus, the light may not be emitted from the light-emitting surface of the display panel, and the light-emitting effect may not be affected. Further, due to the optical layer, the reflected light may be prevented from reaching the array layer, being scattered again, or being mirror reflected again.

In some embodiments of the present disclosure, the gap between the optical layer 500 and the light-emitting device 400 may be filled with air or a filling material with a refractive index less than a refractive index of glass or less than 1.5.

In some embodiments, a third gap 330 is formed between the optical layer 500 and the light-emitting device 400. The third gap 330 may be filled with air or a filling material with a refractive index less than a refractive index of glass or less than 1.5.

In some embodiments, the third gap 330 may include the first gap 310 above.

In some embodiments, the third gap 330 may also include the second gap 320 above.

Figure 17:
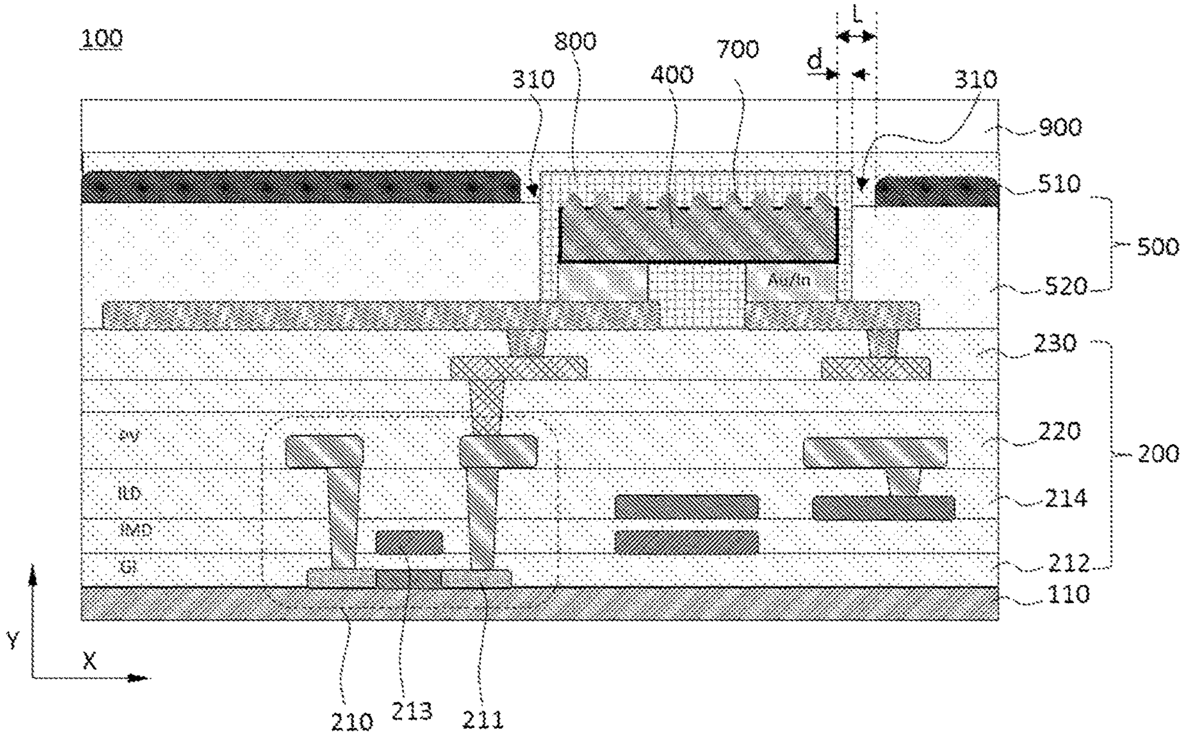
Figure 18:
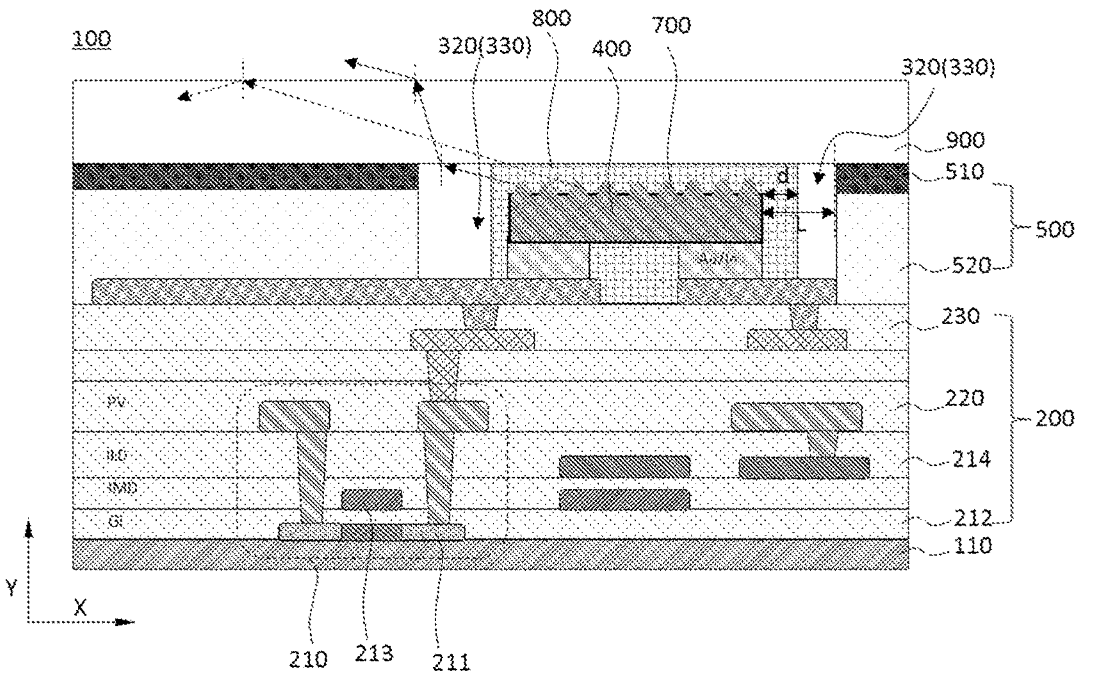

In some other embodiments, as shown in FIGS. 17 and 18, the sidewall of the light-emitting device 400 is also covered with a cover layer 800. For example, the cover layer 800 covers the sidewall of the light-emitting device 400. A thickness of the cover layer 800 at the sidewall of the light-emitting device 400 is d (the thickness is parallel to the thickness in the first direction X). The interval between the optical layer 500 and the light-emitting device 400 is L. In some embodiments, L may be greater than d. Therefore, even if the light-emitting device 400 and the optical layer 500 are spaced by the cover layer 800, a space may be still available for filling a medium to satisfy the requirements of the third gap 330. In some embodiments, the third gap 330 is between the cover layer 800 and the optical layer 500 in the first direction X, and is defined by the optical layer 500 and the cover layer 800.

In some embodiments, for example, the third gap 300 may be filled with air, and the protection layer 900 may include the cover glass. A certain air gap may be arranged around the Micro-LED chip or the packaged Micro-LED chip. A path of light with a large view angle of the Micro-LED may be changed after passing through the cover glass. The light type may be converged, and the total reflection of the light with the large view angle inside the glass may be improved.

In some embodiments, the first optical layer, e.g., a black ink/adhesive film, may be formed on the upper cover glass (i.e., the protection layer). A position of the array layer corresponding to the optical layer may form a height difference with the top of the light-emitting device or the top of the cover layer. After the upper cover glass and the array layer are paired together, the third gap, that is an air gap, may be formed.

Figure 20:
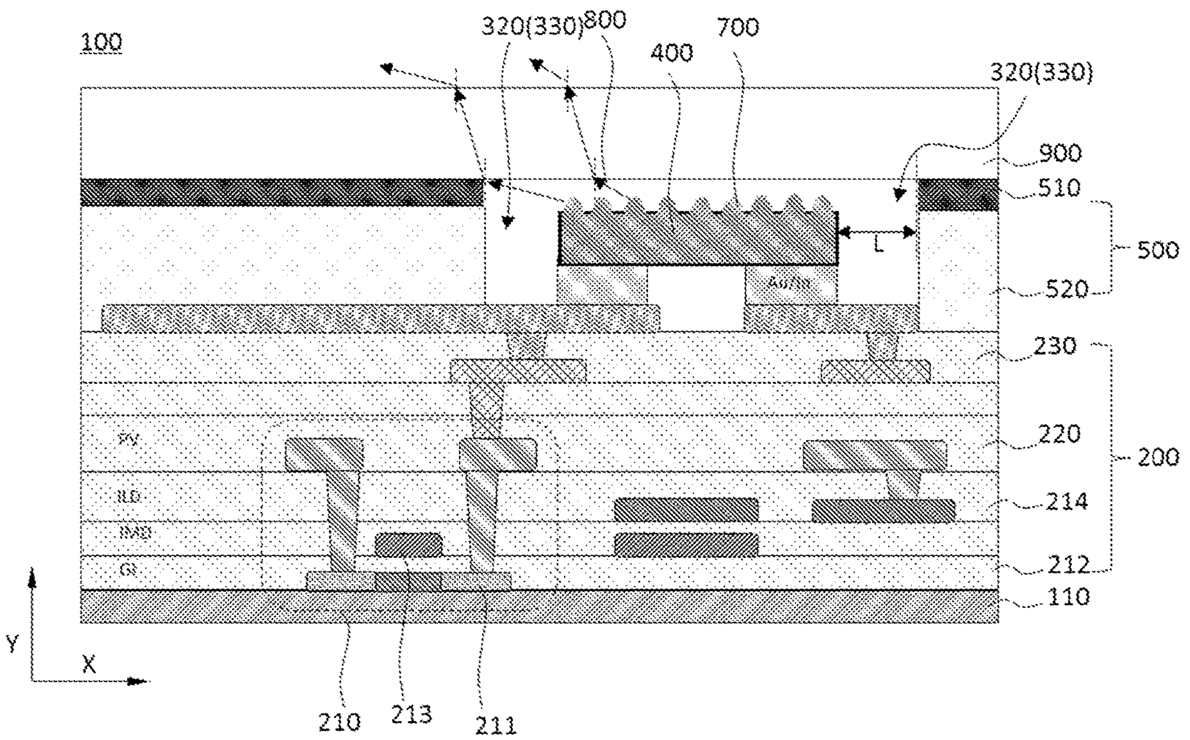

FIG. 20 is another schematic partial cross-section view along the A-A direction of FIG. 1.

In some embodiments, a display panel 100 further includes a protection layer 900 on a side of an optical layer 500 away from an array layer 200.

Air or a filling material with a refractive index less than a refractive index of glass or less than 1.5 may be filled between the light-emitting device and the protection layer 900.

In some embodiments, the light-emitting device 400 further includes a third gap 330. That is, the light-emitting device may be covered in a plurality of surfaces by a medium having a similar refractive index, such as air.

In some embodiments, the cover layer may be no longer arranged on a top surface of the light-emitting device 400.

In some embodiments, a second gap 320 exists between the optical layer 500 and the light-emitting device 400.

In some embodiments, the second gap 320 may form a part of the third gap 330. The third gap 330 may further include a gap between the protection layer 900 and the light-emitting device 400.

Some arrow lines in FIGS. 18 to 20 represent optical paths.

Figure 22:
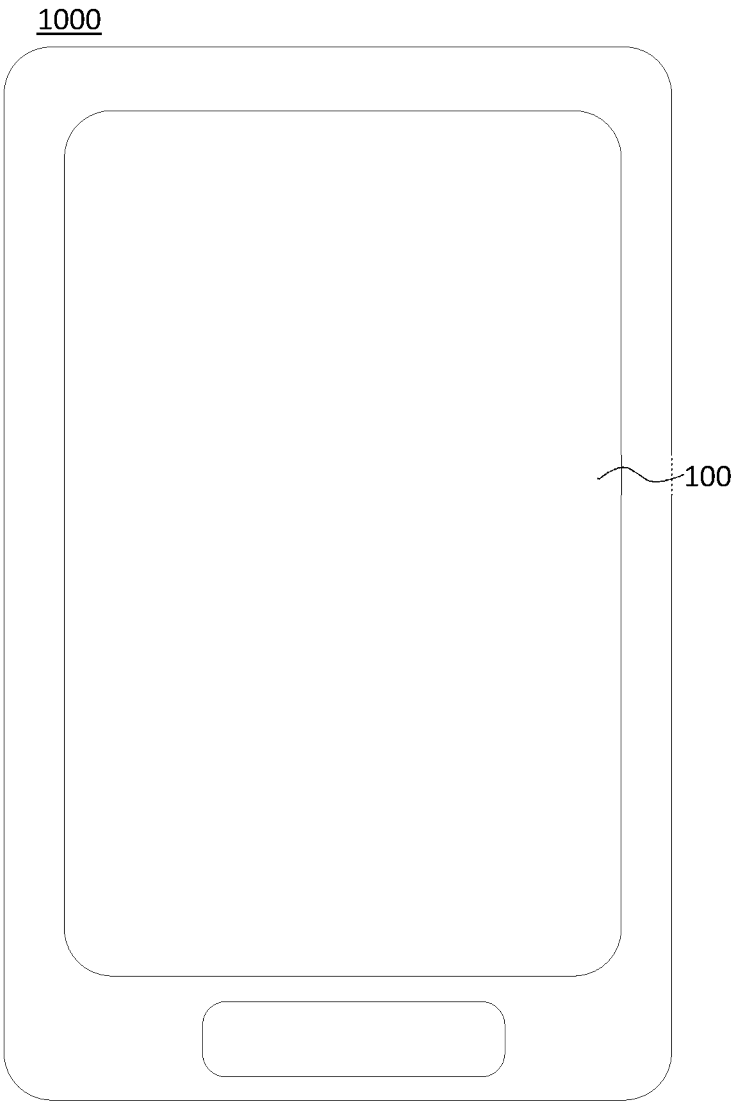
FIG. 22 is a schematic structural diagram of a display device according to some embodiments of the present disclosure.

The present disclosure further provides a display device, including the display panel of the present disclosure. FIG. 22 is a schematic structural diagram of the display device 1000 according to some embodiments of the present disclosure. The display device 1000 includes the display panel 100 of embodiments of the present disclosure. As shown in FIG. 22, a cell phone is taken as an example to describe the display device 1000. The display device of embodiments of the present disclosure may include a computer, a TV, a vehicle-mounted display device, and another display device with a display function, which is not limited to embodiments of the present disclosure. The display device of embodiments of the present disclosure may include beneficial effects of the display panel of embodiments of the present disclosure. For details, references may be made to the description of the display panel above, which is not repeated here.

The above content further describes the present disclosure in connection with embodiments of the present disclosure. Embodiments of the present disclosure are not limited to the description. For those of ordinary skill in the art, without departing from the concept of the present disclosure, some simple deductions or substitutions may be made. These deductions and substitutions should be within the scope of the present disclosure.

What is claimed is:

1. A display panel comprising:
a substrate;
an array layer on the substrate; and
an optical layer and a plurality of light-emitting devices located on a side of the array layer away from the substrate, the optical layer being arranged corresponding to intervals between light-emitting devices of the plurality of light-emitting devices,
wherein:
the optical layer includes a first optical layer and a second optical layer stacked in sequence along a direction from the array layer toward the substrate; and
the second optical layer climbs a slope along a sidewall of a light-emitting device of the plurality of light-emitting devices, and the first optical layer overlaps the second optical layer at the climbed slope.

2. The display panel according to claim 1, wherein:
the first optical layer includes a black layer; and
the second optical layer includes a white layer.

3. The display panel according to claim 1, wherein:
a first gap is between the first optical layer and the light-emitting device of the plurality of light-emitting devices; and
the first gap exposes at least a portion of the second optical layer.

4. The display panel according to claim 3, wherein:
a dimension of the first gap is L; and
Lmax=log (light intensity of the light-emitting device)/unit optical density (OD) value of the second optical layer.

5. The display panel according to claim 3, wherein:
the plurality of light-emitting devices include a first light-emitting device and a second light-emitting device;
the first gap corresponding to the first light-emitting device is L1;
the first gap corresponding to the second light-emitting device is L2; and
L1 is smaller than L2, a wavelength of color light corresponding to the first light-emitting device being smaller than a wavelength of color light corresponding to the second light-emitting device.

6. The display panel according to claim 1, wherein:
a top surface of the optical layer is higher than a top surface of the light-emitting device of the plurality of light-emitting devices over the substrate.

7. The display panel according to claim 6, wherein:
the optical layer is 10 μm to 15 μm higher than the light-emitting device.

8. The display panel according to claim 1, wherein:
a second gap is between the optical layer and the light-emitting device of the plurality of light-emitting devices.

9. The display panel according to claim 8, wherein:
the optical layer includes a single black film layer.

10. The display panel according to claim 1, wherein:
the optical layer includes at least one of an ink layer or an adhesive layer.

11. The display panel according to claim 1, wherein:
a third gap is formed between the optical layer and the light-emitting device of the plurality of light-emitting devices; and
the third gap is filled with air or filled with a filling material having a refractive index less than glass or less than 1.5.

12. A display panel, comprising:
a substrate;
an array layer on the substrate; and
an optical layer and a plurality of light-emitting devices located on a side of the array layer away from the substrate, the optical layer being arranged corresponding to intervals between light-emitting devices of the plurality of light-emitting devices,
wherein:
the optical layer includes a first optical layer and a second optical layer stacked in sequence along a direction from the array layer toward the substrate; and
the second optical layer climbs a slope along a sidewall of a light-emitting device of the plurality of light-emitting devices, and the first optical layer overlaps the second optical layer at the climbed slope; or
wherein:
the display panel further includes a cover layer, and the cover layer covers the light-emitting device of the plurality of light-emitting devices;
the cover layer includes a first region and a second region;
the first region covers the light-emitting device of the plurality of light-emitting devices;
the second region is covered by the optical layer;
the second region is located on a side of the optical layer facing the array layer;
along a direction perpendicular to a plane where the display panel is located, a top surface of the first region is higher than a top surface of the second region;
the array layer includes a light-transmission region;
the light-transmission region is filled with a light-transmission material; and
the cover layer and the light-transmission material are in a same layer and include a same material.

13. The display panel according to claim 1, wherein:
the display panel further includes a cover layer, and the cover layer covers the light-emitting device of the plurality of light-emitting devices;
the display panel further includes a protection layer on a side of the optical layer away from the array layer;
the cover layer is in contact with the protection layer; and
a difference between a refractive index of the cover layer and a refractive index of the protection layer is less than 0.5.

14. The display panel according to claim 1, wherein:
a top surface of the light-emitting device includes a concave-convex structure.

15. The display panel according to claim 1, wherein:
the light-emitting device of the plurality of light-emitting devices includes Micro-LED.

16. A display device comprising:
a display panel including:
a substrate;
an array layer on the substrate; and an optical layer and a plurality of light-emitting devices located on a side of the array layer away from the substrate, the optical layer being arranged corresponding to intervals between light-emitting devices of the plurality of light-emitting devices, wherein:

the optical layer includes a first optical layer and a second optical layer stacked in sequence along a direction from the array layer toward the substrate; and the second optical layer climbs a slope along a sidewall of a light-emitting device of the plurality of light-emitting devices, and the first optical layer overlaps the second optical layer at the climbed slope.

17. The display panel according to claim 1, wherein:

the display panel further includes a cover layer, and the cover layer covers the light-emitting device of the plurality of light-emitting devices;

the cover layer includes a first region and a second region;

the first region covers the light-emitting device of the plurality of light-emitting devices;

the second region is covered by the optical layer;

the second region is located on a side of the optical layer facing the array layer; and along a direction perpendicular to a plane where the display panel is located, a top surface of the first region is higher than a top surface of the second region.

* * * * *